(12) United States Patent  (10) Patent No.: US 12,089,437 B2
Ma et al.  (45) Date of Patent: Sep. 10, 2024

(54) FLEXIBLE ELECTROLUMINESCENT DEVICES

(71) Applicant: Shoei Chemical Inc., Tokyo (JP)

(72) Inventors: Ruiqing Ma, Morristown, NJ (US); Jason Hartlove, Los Altos, CA (US); Charles Hotz, San Rafael, CA (US)

(73) Assignee: SHOEI CHEMICAL INC., Tokyo (JP)

(*) Notice: Subject to any disclaimer, the term of this patent is extended or adjusted under 35 U.S.C. 154(b) by 451 days.

(21) Appl. No.: 17/604,684

(22) PCT Filed: Apr. 17, 2020

(86) PCT No.: PCT/US2020/028718
§ 371 (c)(1),
(2) Date: Oct. 18, 2021

(87) PCT Pub. No.: WO2020/214930
PCT Pub. Date: Oct. 22, 2020

(65) Prior Publication Data
US 2022/0209199 A1  Jun. 30, 2022

Related U.S. Application Data

(60) Provisional application No. 62/836,286, filed on Apr. 19, 2019.

(51) Int. Cl.
*H10K 50/858* (2023.01)
*H10K 50/115* (2023.01)
(Continued)

(52) U.S. Cl.
CPC ......... *H10K 50/858* (2023.02); *H10K 50/115* (2023.02); *H10K 71/00* (2023.02);
(Continued)

(58) Field of Classification Search
CPC .... H10K 50/858; H10K 50/115; H10K 71/00; H10K 50/844; H10K 50/87;
(Continued)

(56) References Cited

U.S. PATENT DOCUMENTS 9,680,054 B2   6/2017  Coe-Sullivan et al.
11,380,863 B2  7/2022  Zehnder et al.
(Continued)

FOREIGN PATENT DOCUMENTS

EP    3282000 A1      2/2018
WO    WO-2019/071703 A1  4/2019

OTHER PUBLICATIONS

Notification of Transmittal of the International Search Report and Written Opinion of the International Searching Authority, PCT App. No. PCT/US2020/028718, 16 pages, mailed Jul. 27, 2020.
(Continued)

*Primary Examiner* — J. E. Schoenholtz
(74) *Attorney, Agent, or Firm* — Alleman Hall & Tuttle LLP

(57) ABSTRACT

Embodiments of a flexible electroluminescent (FEE) device are described. An FEE device includes a device stack with a quantum dot (QD) film configured to generate a first light having a first peak wavelength and a flexible substrate configured to support the device stack and emit a first portion of the first light. The FEE device further includes an encapsulation layer disposed on the device stack and an outcoupling layer disposed on the flexible substrate. The encapsulation layer can be configured to provide mechanical and environmental protection to the FEE device from moisture or oxygen. The outcoupling layer can be configured to prevent total internal reflection of a second portion of the first light within the flexible substrate and extract the second portion from the flexible substrate. The outcoupling layer
(Continued)

can be further configured to eliminate air gaps at an interface between the outcoupling layer and a surface to be illuminated by the extracted second portion in response to the FEE device being substantially conformally placed on the surface.

19 Claims, 5 Drawing Sheets

(51) Int. Cl.
   *H10K 50/844* (2023.01)
   *H10K 50/87* (2023.01)
   *H10K 71/00* (2023.01)
   *H10K 77/10* (2023.01)
   *H10K 102/00* (2023.01)

(52) U.S. Cl.
   CPC .......... *H10K 50/844* (2023.02); *H10K 50/87* (2023.02); *H10K 77/111* (2023.02); *H10K 2102/311* (2023.02)

(58) Field of Classification Search
   CPC ............ H10K 77/111; H10K 2102/311; H10K 50/13; H10K 50/85; H10K 50/84
   See application file for complete search history.

(56) References Cited

U.S. PATENT DOCUMENTS

| | | | |
|---|---|---|---|
| 2015/0076469 A1* | 3/2015 | Ikemizu | H10K 50/11 257/40 |
| 2018/0151843 A1* | 5/2018 | Ma | H10K 50/828 |
| 2019/0189869 A1 | 6/2019 | Xiao et al. | |
| 2021/0244962 A1* | 8/2021 | Castel | A61N 5/0613 |
| 2022/0102686 A1* | 3/2022 | Song | H10K 50/8445 |
| 2022/0407025 A1 | 12/2022 | Zehnder et al. | |
| 2023/0422545 A1* | 12/2023 | Pschenitzka | H10K 59/8731 |

OTHER PUBLICATIONS

Chen, H. et al., "Flexible quantum dot light-emitting devices for targeted photomedical applications," Journal of the SID 26/5, 2018, pp. 296-303.

China National Intellectual Property Administration, Office Action and Search Report Issued in Application No. 202080029955.3, Oct. 31, 2023, 11 pages.

\* cited by examiner

FLEXIBLE ELECTROLUMINESCENT DEVICES

BACKGROUND OF THE INVENTION

Field

The present invention relates to electroluminescent devices (e.g., light emitting diodes (LEDs)) having luminescent nanostructure (e.g., quantum dot (QD)) based emission layers on flexible substrates.

Background

Electroluminescent (EL) devices are used as light sources in displays (e.g., phones, tablets, monitors, televisions, or digital billboards) and medical applications (e.g., photomedicine). With the increase in demand for portable and wearable devices, EL devices (e.g., LEDs and organic LEDs (OLEDs)) have been made on lightweight and flexible substrates, which can be curved without causing structural and functional damage to the EL devices.

However, one of the challenges is producing flexile EL (FEL) devices that emit light with high brightness (also referred to as luminance) (e.g., brightness greater than about 20,000 candelas per square meter (cd/m2)) at low driving voltages (e.g., voltages less than about 8 volts(V)) for effective penetration of the light into the human skin for photomedical applications, for example. Another challenge is encapsulating the FEL devices to provide them with mechanical and/or environmental protection (e.g., protection from moisture and/or contaminants) in order to achieve similar or longer operational lifetime and efficiency compared to the non-flexible EL devices. Also, manufacturing and encapsulating of FEL devices at low costs with simple processing technologies for ease of mass production is challenging.

SUMMARY

The present disclosure provides example inexpensive, high brightness light producing FEL devices with nanostructure (NS)-based emission layers (EMLs) and effective encapsulation against moisture, oxygen, and/or contaminants. The present disclosure also provides example inexpensive methods for fabricating the same.

In some embodiments, the FEL devices can be configured to emit light with high brightness at one or more primary emission peak wavelengths in the visible and/or infrared (IR) spectra (e.g., primary emission peak wavelengths within a range of about 600 nm to about 1200 nm). The light brightness from these NS-based FEL devices can be higher than the FEL devices with non-NS based EMLs, such as OLEDs because the efficiency of OLEDs typically decreases at high light brightness levels, an effect known as efficiency roll-off, and OLEDs have significant efficiency roll-off at high current density.

The above configurations of the NS-based FEL devices can be achieved with cadmium-free (Cd-free) NSs in their EMLs, but a cadmium NS can be used. In some embodiments, the Cd-free FEL devices can produce light at one or more wavelengths in the visible and/or IR spectra (e.g., at about 630 nm) with brightness greater than about 20,000 cd/m$^2$ at low driving voltages (e.g., about 25,000 cd/m$^2$ at 7V). The Cd-free FEL devices can be suitable for applications in photomedicine, for example, as the intrinsic toxic properties of cadmium can be detrimental to human health.

Such Cd-free FEL devices can be used externally on the human skin and/or can be placed inside the human body for phototreatments. In some embodiments, the Cd-free FEL devices can activate a treatment compound or a photoinhibitor formulated into the treatment compound at a treatment site by exciting the charge state in the molecules of the treatment compound. The treatment site can be on the human skin or inside the human body.

In some embodiments, the FEL devices can be configured to be stretchable and/or to be substantially conformal to non-uniform surfaces, such as the human skin for photomedical applications. One example application on non-uniform surfaces can be LED bandages having the NS-based FEL devices as light sources. The LED bandages can be placed conformally on the treatment site and the light from the FEL devices can be used for phototreatment. In some embodiments, FEL devices can have thermal conductive layers configured to dissipate heat away from the light emitting sides of the FEL devices. As such, the FEL devices used, for example, in photomedical applications can effectively dissipate heat away from the treatment site. Alternatively, the amount of heat dissipation can be controlled for heat-based treatments.

In some embodiments, the luminescent NSs in the emission layers (EMLs) can have barrier coatings configured to provide the EMLs with encapsulation against moisture and/or contaminants. As such, the FEL devices does not have to be encapsulated with barrier materials having very low water vapor transmission rate (WVTR) (e.g., less than 10$^{-5}$ g/m$^2$-day), which can require complicated and/or expensive encapsulation processes. The FEL devices can be encapsulated with inexpensive barrier materials having relatively high WVTR (e.g., 10$^{-5}$ g/m$^2$-day, 10$^{-4}$ g/m$^2$-day, 10$^{-3}$ g/m$^2$-day, 10$^{-2}$ g/m$^2$-day, or 10$^{-1}$ g/m$^2$-day) using simple encapsulation processes, and consequently, reducing the manufacturing cost and facilitating mass production.

According to an embodiment, an FEL device includes a device stack with a quantum dot (QD) film configured to generate a first light having a first peak wavelength and a flexible substrate configured to support the device stack and emit a first portion of the first light. The FEL device further includes an encapsulation layer disposed on the device stack and an outcoupling layer disposed on the flexible substrate. The encapsulation layer can be configured to provide mechanical and environmental protection to the FEL device from moisture or oxygen. The outcoupling layer can be configured to prevent total internal reflection of a second portion of the first light within the flexible substrate and extract the second portion from the flexible substrate. The outcoupling layer can be further configured to eliminate air gaps at an interface between the outcoupling layer and a surface to be illuminated by the extracted second portion in response to the FEL device being substantially conformally placed on the surface.

According to an embodiment, an FEL device includes a flexible substrate and first and second device stacks disposed on the flexible substrate. The first and second device stacks includes first and second quantum dot (QD)-based emission layers (EMLs) configured to simultaneously emit first and second light having first and second peak wavelengths, respectively. The first and second peak wavelengths are different from each other. The FEL device further includes an encapsulation layer disposed on the first and second device stacks and an outcoupling layer disposed on the flexible substrate. The outcoupling layer can be configured to simultaneously extract portions of the first and second light from the device stack.

According to an embodiment, a method of fabricating an FEL device includes providing a flexible substrate with a pre-deposited layer of anode, forming a QD film on the pre-deposited layer of anode, forming a cathode on the QD film, forming an encapsulation layer on the cathode, and forming an outcoupling layer on the encapsulation layer.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWGINS/FIGURES

The accompanying drawings, which are incorporated herein and form part of the specification, illustrate the present embodiments disclosed herein and, together with the description, further serve to explain the principles of the present embodiments and to enable a person skilled in the relevant art(s) to make and use the present embodiments.

Figures 1, 2:
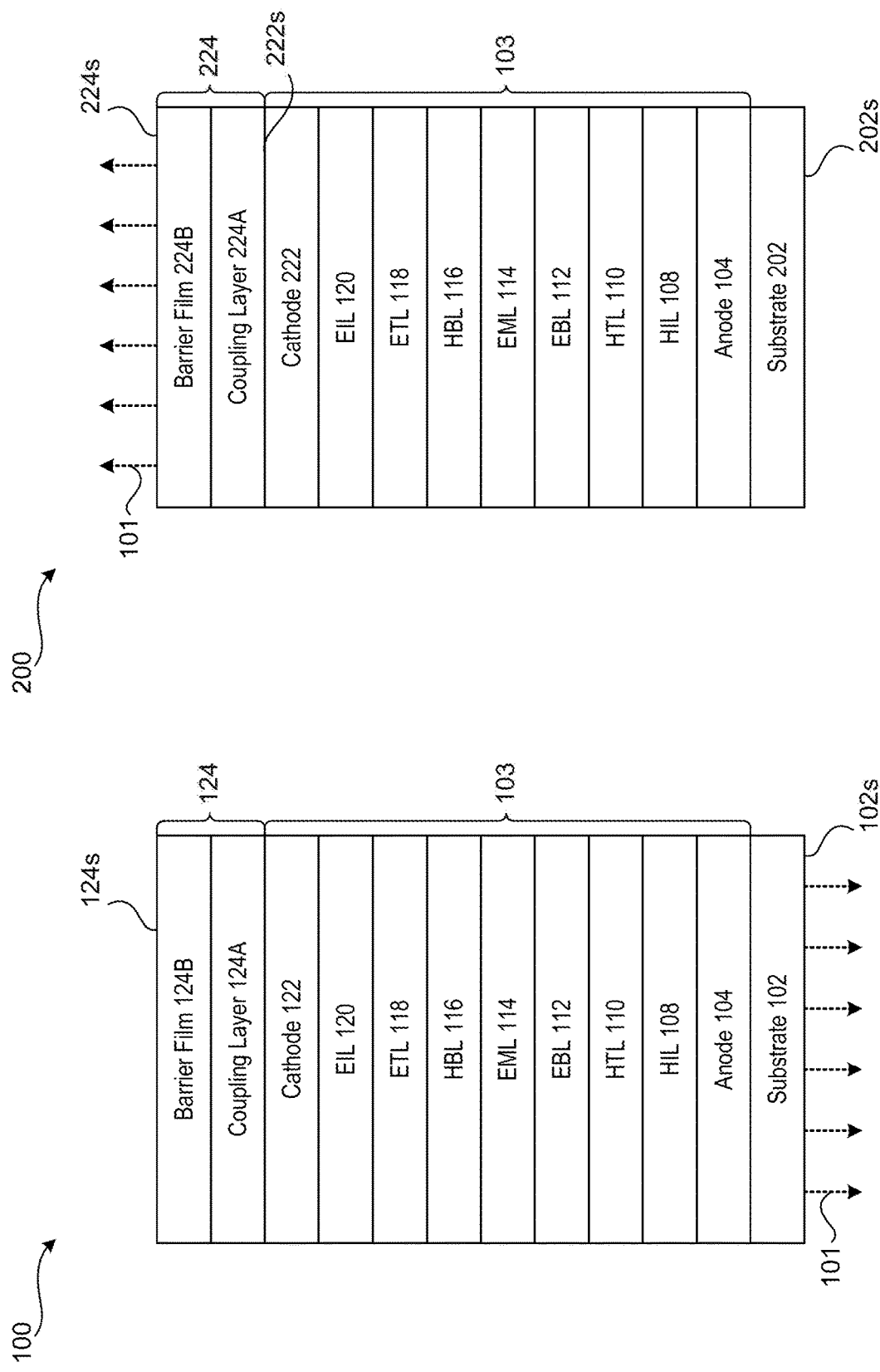
FIG. 1 is a schematic of a cross-sectional view of a bottom emitting flexible electroluminescent (FEL) device with an encapsulation layer, according to some embodiments.
FIG. 2 is a schematic of a cross-sectional view of a top emitting FEL device with an encapsulation layer, according to some embodiments.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements unless mentioned otherwise. The drawing in which an element first appears is indicated by the leftmost digit(s) in the corresponding reference number. Unless otherwise indicated, the drawings provided throughout the disclosure should not be interpreted as to-scale drawings.

DETAILED DESCRIPTION OF THE INVENTION

Although specific configurations and arrangements may be discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications beyond those specifically mentioned herein. It should be appreciated that the particular implementations shown and described herein are examples and are not intended to otherwise limit the scope of the application in any way.

It is noted that references in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

All numbers in this description indicating amounts, ratios of materials, physical properties of materials, and/or use are to be understood as modified by the word "about," except as otherwise explicitly indicated.

In embodiments, the term "display device" refers to an arrangement of elements that allow for the visible representation of data on a display screen. Suitable display screens can include various flat, curved or otherwise-shaped screens, films, sheets or other structures for displaying information visually to a user. Display devices described herein can be included in, for example, display systems encompassing a liquid crystal display (LCD), televisions, computers, monitors, mobile phones, smart phones, personal digital assistants (PDAs), gaming devices, electronic reading devices, digital cameras, tablets, wearable devices, car navigation systems, digital signage, augmented reality, virtual reality, and the like.

The term "about" as used herein indicates the value of a given quantity varies by ±10% of the value. For example, "about 100 nm" encompasses a range of sizes from 90 nm to 110 nm, inclusive.

The term "substantially" as used herein indicates the value of a given quantity varies by ±1% to ±5% of the value.

In embodiments, the term "optically coupled" means that components are positioned such that light is able to pass from one component to another component without substantial interference.

The term "nanostructure" as used herein refers to a structure having at least one region or characteristic dimension with a dimension of less than about 500 nm. In some embodiments, the nanostructure has a dimension of less than about 200 nm, less than about 100 nm, less than about 50 nm, less than about 20 nm, or less than about 10 nm. Typically, the region or characteristic dimension will be along the smallest axis of the structure. Examples of such structures include nanowires, nanorods, nanotubes, branched nanostructures, nanotetrapods, tripods, bipods, nanocrystals, nanodots, QDs, nanoparticles, and the like. Nanostructures can be, e.g., substantially crystalline, substantially monocrystalline, polycrystalline, amorphous, or a combination thereof. In some embodiments, each of the three dimensions of the nanostructure has a dimension of less than about 500 nm, less than about 200 nm, less than about 100 nm, less than about 50 nm, less than about 20 nm, or less than about 10 nm.

The term "QD" or "nanocrystal" as used herein refers to nanostructures that are substantially monocrystalline. A nanocrystal has at least one region or characteristic dimension with a dimension of less than about 500 nm, and down to the order of less than about 1 nm. The terms "nanocrystal," "QD," "nanodot," and "dot," are readily understood by the ordinarily skilled artisan to represent like structures and are used herein interchangeably. The present invention also encompasses the use of polycrystalline or amorphous nanocrystals.

The term "heterostructure" when used with reference to nanostructures refers to nanostructures characterized by at least two different and/or distinguishable material types. Typically, one region of the nanostructure comprises a first material type, while a second region of the nanostructure comprises a second material type. In some embodiments, the nanostructure comprises a core of a first material and at least one shell of a second (or third etc.) material, where the different material types are distributed radially about the long axis of a nanowire, a long axis of an arm of a branched nanowire, or the center of a nanocrystal, for example. A shell can but need not completely cover the adjacent materials to be considered a shell or for the nanostructure to be considered a heterostructure; for example, a nanocrystal characterized by a core of one material covered with small islands of a second material is a heterostructure. In other embodiments, the different material types are distributed at different locations within the nanostructure; e.g., along the major (long) axis of a nanowire or along a long axis of arm of a branched nanowire. Different regions within a heterostructure can comprise entirely different materials, or the different regions can comprise a base material (e.g., silicon) having different dopants or different concentrations of the same dopant.

As used herein, the term "diameter" of a nanostructure refers to the diameter of a cross-section normal to a first axis of the nanostructure, where the first axis has the greatest difference in length with respect to the second and third axes (the second and third axes are the two axes whose lengths most nearly equal each other). The first axis is not necessarily the longest axis of the nanostructure; e.g., for a disk-shaped nanostructure, the cross-section would be a substantially circular cross-section normal to the short longitudinal axis of the disk. Where the cross-section is not circular, the diameter is the average of the major and minor axes of that cross-section. For an elongated or high aspect ratio nanostructure, such as a nanowire, the diameter is measured across a cross-section perpendicular to the longest axis of the nanowire. For a spherical nanostructure, the diameter is measured from one side to the other through the center of the sphere.

The terms "crystalline" or "substantially crystalline," when used with respect to nanostructures, refer to the fact that the nanostructures typically exhibit long-range ordering across one or more dimensions of the structure. It will be understood by one of skill in the art that the term "long range ordering" will depend on the absolute size of the specific nanostructures, as ordering for a single crystal cannot extend beyond the boundaries of the crystal. In this case, "long-range ordering" will mean substantial order across at least the majority of the dimension of the nanostructure. In some instances, a nanostructure can bear an oxide or other coating, or can be comprised of a core and at least one shell. In such instances it will be appreciated that the oxide, shell(s), or other coating can but need not exhibit such ordering (e.g. it can be amorphous, polycrystalline, or otherwise). In such instances, the phrase "crystalline," "substantially crystalline," "substantially monocrystalline," or "monocrystalline" refers to the central core of the nanostructure (excluding the coating layers or shells). The terms "crystalline" or "substantially crystalline" as used herein are intended to also encompass structures comprising various defects, stacking faults, atomic substitutions, and the like, as long as the structure exhibits substantial long range ordering (e.g., order over at least about 80% of the length of at least one axis of the nanostructure or its core). In addition, it will be appreciated that the interface between a core and the outside of a nanostructure or between a core and an adjacent shell or between a shell and a second adjacent shell can contain non-crystalline regions and can even be amorphous. This does not prevent the nanostructure from being crystalline or substantially crystalline as defined herein.

The term "monocrystalline" when used with respect to a nanostructure indicates that the nanostructure is substantially crystalline and comprises substantially a single crystal. When used with respect to a nanostructure heterostructure comprising a core and one or more shells, "monocrystalline" indicates that the core is substantially crystalline and comprises substantially a single crystal.

The term "ligand" as used herein refers to a molecule capable of interacting (whether weakly or strongly) with one or more faces of a nanostructure, e.g., through covalent, ionic, van der Waals, or other molecular interactions with the surface of the nanostructure.

The term "quantum yield" (QY) as used herein refers to the ratio of photons emitted to photons absorbed, e.g., by a nanostructure or population of nanostructures. As known in the art, quantum yield is typically determined by a comparative method using well-characterized standard samples with known quantum yield values.

The term "primary emission peak wavelength" as used herein refers to the wavelength at which the emission spectrum exhibits the highest intensity.

The term "full width at half-maximum" (FWHM) as used herein refers to refers to a measure of spectral width. In the case of an emission spectrum, a FWHM can refer to a width of the emission spectrum at half of a peak intensity value.

The term Forster radius used herein is also referred as Forster distance in the art.

The term "nanostructure (NS) film" is used herein to refer to a film having luminescent nanostructures.

The term "flexible" is used herein to refer to an element that is capable of being bent, twisted, folded, conformed, rolled into a tubular form, compressed, or similarly manipulated without structural and/or functional damage to the element. The term "flexible" is also used herein to refer to an element that is capable of being stretched without structural and/or functional damage to the element.

The term "near infrared (NIR) wavelength region" is used herein to refer to a wavelength region of the IR spectrum that can include wavelengths ranging from about 750 nm to about 1200 nm, according to some embodiments.

The term "red wavelength region" is used herein to refer to a wavelength region of the visible spectrum that can include wavelengths ranging from about 620 nm to about 750 nm, according to some embodiments.

The term "green wavelength region" is used herein to refer to a wavelength region of the visible spectrum that can include wavelengths ranging from about 495 nm to about 570 nm, according to some embodiments.

The term "blue wavelength region" is used herein to refer to a wavelength region of the visible spectrum that can include wavelengths ranging from about 435 nm to about 495 nm, according to some embodiments.

The published patents, patent applications, websites, company names, and scientific literature referred to herein are hereby incorporated by reference in their entirety to the same extent as if each was specifically and individually indicated to be incorporated by reference. Any conflict between any reference cited herein and the specific teachings of this specification shall be resolved in favor of the latter. Likewise, any conflict between an art-understood definition of a word or phrase and a definition of the word or phrase as specifically taught in this specification shall be resolved in favor of the latter.

Technical and scientific terms used herein have the meaning commonly understood by one of skill in the art to which the present application pertains, unless otherwise defined. Reference is made herein to various methodologies and materials known to those of skill in the art.

Example Embodiments of Flexible Electroluminescent Devices

FIG. 1 illustrates a schematic of a cross-sectional view of a bottom emitting flexible electroluminescent (FEL) device 100, according to some embodiments. In some embodiments, FEL device 100 can be configured to generate images on flexible displays, to provide flexible light sources for applications in photomedical applications (e.g., photomedicine), and/or other FEL device-based flexible devices. The term "flexible" is used herein to refer to an element that is capable of being bent in all directions, twisted, folded, rolled into a tubular form, compressed, or similarly manipulated without structural and/or functional damage to the element. The term "flexible" is also used herein to refer to an element that is capable of being stretched in opposite directions without structural and/or functional damage to the element.

In some embodiments, FEL device 100 can be configured to emit light with high brightness at one or more primary emission peak wavelengths in the visible and/or infrared (IR) spectra (e.g., primary emission peak wavelengths within a range of about 600 nm to about 1100 nm). The light brightness from FEL device 100 can be higher than OLEDs because the efficiency of OLEDs typically decreases at high light brightness levels, an effect known as efficiency roll-off, and OLEDs have significant quantum efficiency roll-off at high current density.

In some embodiments, FEL device 100 can include a substrate 102, a device stack 103 disposed on substrate 102, and an encapsulation layer 124 disposed on device 103. Substrate 102 can be configured to support device stack 103 and optionally to support a control circuitry (not shown) for controlling operation of device stack 103. In some embodiments, substrate 102 can be flexible and/or can be substantially conformal to non-uniform surfaces, such as the human skin for photomedical applications of FEL device 100. In some embodiments, substrate 102 can be optically transparent to allow light 101 generated by device stack 103 to be emitted through substrate 102 without substantially absorbing light 101. Light 101 emitted from device stack is represented in FIG. 1 by black arrows pointing towards −Z-direction.

In some embodiments, substrate 102 can include a corrugated structure, such that the layers of device stack 103 do not encounter tensile forces during stretching of FEL device 100. In some embodiments, substrate 102 can include a polymeric material, such as plastic, polyethylene terephthalate (PET), or other suitable flexible polymeric materials. In some embodiments, substrate 102 include ultrathin silver, silver mesh, silver nanowires, conductive organic polymer, or other suitable conductive materials that does not include indium-tin-oxide (ITO). In some embodiments, substrate 102 can have a vertical dimension (e.g., thickness) along a Z-axis ranging from about 10 μm to about 150 μm (e.g., about 10 μm, about 12 μm, about 25 μm, about 75 μm, about 100 μm, about 125, μm or about 150 μm). In some embodiments, surface 102s of substrate 102 can serve as a screen to display images generated using light 101. In some embodiments, substrate 102 can serve as an encapsulation layer to provide environmental protection to FEL device 100. The materials of substrate 102 can be selected to have barrier properties, such as a water vapor transmission rate (WVTR) ranging from about $10^{-5}$ g/m$^2$-day to about 10 g/m$^2$-day (e.g., about $10^{-5}$ g/m$^2$-day, about $10^{-4}$ g/m$^2$-day, about $10^{-3}$ g/m$^2$-day, about $10^{-2}$ g/m$^2$-day, or about $10^{-1}$ g/m$^2$-day).

Device stack 103 can include an anode 104 disposed on substrate 102, a hole injection layer (HIL) 108 disposed on anode 104, a hole transport layer (HTL) 110 on HIL 108, an electron blocking layer (EBL) 112 disposed on HTL 110, an emission layer (EML) 114 disposed on EBL 112, a hole blocking layer (HBL) 116 disposed on EML 114, an electron transport layer (ETL) 118 disposed on HBL 116, an electron injection layer (EIL) 120 disposed on ETL 118, and a cathode 122 disposed on EIL 120, according to some embodiments. In some embodiments, device stack 103 can include anode 104, HTL 110, EML 114 disposed on HTL 110, and cathode 122 disposed on EML 114, without HIL 108, EBL 112, HBL 116, ETL 118, or EIL 120. In some embodiments, device stack 103 can include anode 104, emission layer (EML) 114 disposed on anode 104, and cathode 122 disposed on EML 114, without HIL 108, HTL 110, EBL 112, HBL 116, ETL 118, or EIL 120.

FEL device 100 can be configured to emit light 101 in the visible and IR spectra (e.g., red, green, blue, or IR) based on the composition of EML 114. In some embodiments, EML 114 can include one or more NS-based light emitting layers, or a combination of NS-based and organic light emitting layers. In some embodiments, the NS-based light emitting layer (e.g., NS film 1000 described with reference to FIG. 10) can include luminescent NSs such as QDs (e.g., NS 900 described with reference to FIG. 9). The size and material of NSs of the NS-based light emitting layer in EML 114 can be selected based on the desired color (e.g., red, green, blue, or IR) of light 101 emitted through substrate 102.

In some embodiments, the size and material of NSs of the NS-based light emitting layer in EML 114 can be selected to emit light 101 having a primary emission peak wavelength in the red wavelength region (e.g., wavelengths ranging from about 620 nm to about 750 nm), in the green wavelength region (e.g., wavelengths ranging from about 495 nm to about 570 nm), or in the blue wavelength region (e.g., wavelengths ranging from about 435 nm to about 495 nm) of the visible spectrum. In some embodiments, the size and material of NSs of the NS-based light emitting layer in EML 114 can be selected to emit light 101 having a primary emission peak wavelength in the visible and IR spectra (e.g., wavelengths ranging from about 600 nm to about 1100 nm). In some embodiments, EML 114 can have a population of luminescent NSs configured to emit red, green, blue, NIR, and/or any light in the visible or IR spectra.

In some embodiments, the one or more NS-based light emitting layers of EML 114 can include cadmium-free NSs. Cd-free FEL device 100 can be suitable for applications in photomedicine as the intrinsic toxic properties of cadmium can be detrimental to human health. Such Cd-free FEL device 100 can be used externally on the human skin and/or can be placed inside the human body for phototreatments. In some embodiments, Cd-free FEL device 100 can activate a treatment compound or a photo-inhibitor formulated into the treatment compound at a treatment site by exciting the charge state in its molecules. The treatment site can be on the human skin or inside the human body.

In some embodiments, EML 114 can include indium phosphide (InP)-based NSs, which can emit light 101 having a primary emission peak wavelength in wavelength regions extending from the green wavelength region to the NIR wavelength region (e.g., wavelengths ranging from about 495 nm to about 1200 nm). In some embodiments, EML 114 can include lead sulfide (PbS)—, cadmium phosphide ($Cd_3P_2$)—, silver sulfide ($Ag_2S$)—, silver indium selenide ($AgInSe_2$)—, silicon (Si)—, or Formamidinium-lead-iodide ($FAPbI_3$)— based NSs, which can emit light 101 having a primary emission peak wavelength within the IR wavelength region (e.g., wavelengths ranging from about 800 nm to about 1100 nm). In some embodiments, EML 114 can include group semiconductor compound-based NSs (e.g., copper indium selenide ($CuInSe_2$) or copper indium sulfide ($CuInS_2$)), which can exhibit quantum yield above 60%.

Light 101 with primary emission peak wavelength in the visible or IR spectrum can be generated from EML 114 and emitted from FEL device 100 when a voltage is applied across device stack 103 during operation. Light 101 can be generated when the voltage is applied because electrons and holes recombine in EML 114 to release photons corresponding to wavelengths in the visible and/or IR wavelength regions. The electrons and holes can be injected from cathode 122 and anode 104, respectively, when the voltage is applied such that anode 104 is positive with respect to cathode 122. In some embodiments, EML 114 can be formed on underlying layer by, for example, spin coating, inkjet printing, slot die coating, nozzle printing, contact printing, a suitable solution printing technology, thermal evaporation, or a suitable vapor deposition technology. In some embodiments, EML 114 can include indium phosphide (InP) based QDs having a diameter ranging from about 3 nm to about 25 nm (e.g., about 5 nm, about 10 nm, or about 15 nm) and configured to emit a primary emission peak wavelength in the red wavelength region, the green wavelength region, and/or between the red and green wavelength regions.

Anode 104 can be configured to inject holes to device stack 103 when positively biased during operation, as discussed above. Anode 104 can include electrically conductive and optically transparent materials such as, for example, indium-tin-oxide (ITO), according to some embodiments. In some embodiments, anode 104 can be formed on substrate 102 by depositing and patterning the electrically conductive and optically transparent materials on substrate 102. The deposition can be performed by, for example, sputtering, thermal evaporation, or a suitable method for depositing electrically conductive and optically transparent materials. The patterning can be performed by, for example, a lithography process or a masking process during the deposition. In some embodiments, anode 104 can have a vertical dimension (e.g., thickness) along a Z-axis ranging from about 50 nm to about 150 nm (e.g., about 50 nm, about 80 nm, about 100 nm, about 120 nm, about 125 nm, about 140 nm, or about 150 nm).

Optionally, HIL 108 can be formed on anode 104. HIL 108 can be configured to facilitate the injection of holes from anode 104 into HTL 110. In some embodiments, HIL 108 can have a vertical dimension (e.g., thickness) along a Z-axis ranging from about 3 nm to about 70 nm (e.g., about 3 nm, about 10 nm, about 30 nm, about 40 nm, about 50 nm, about 60 nm, or about 70 nm). In some embodiments, HIL 108 can include p- or n-type, organic or inorganic semiconductor materials such as, for example, metal oxides (e.g., nickel oxide (NiO), molybdenum oxide ($MoO_3$), vanadium oxide ($V_2O_5$), tungsten oxide ($WO_3$)), polyanilines, polythiophenes (e.g., poly(3,4-ethylenedioxythiophene) (PEDOT) doped with poly(styrene sulfonate) (PSS)), Tris[phenyl(m-tolyl)amino]triphenylamine (mTDATA), or hexaazatriphenylene-hexacarbonitrile (HAT-CN). HIL 108 can be deposited on anode 104 by, for example, spin coating, inkjet printing, slot die coating, nozzle printing, contact printing, a suitable solution printing technology, roll-to-roll processing, thermal evaporation, or a suitable vapor deposition technology.

In some embodiments, HTL 110 can be formed on HIL 108 as shown in FIG. 1 or on anode 104 if HIL 108 is optionally not included. HTL 110 can be configured to facilitate the transportation of holes from HIL 108 to EML 114. In some embodiments, HTL 110 can have a vertical dimension (e.g., thickness) along a Z-axis smaller than the vertical dimension of HIL 108 and can range from about 10 nm to about 30 nm (e.g., about 10 nm, about 20 nm, or about 30 nm). In some embodiments, HTL 110 can include p-type, organic or inorganic semiconductor materials such as, for example, metal oxides or nanostructures of metal oxides (e.g., nickel oxide (NiO), molybdenum oxide ($MoO_3$), vanadium oxide ($V_2O_5$), or tungsten oxide ($WO_3$)), or polymers (e.g., poly(N-vinylcarbazole), poly(triarylamines), triphenylamine derivatives, or carbazole derivatives), or small organic molecules (e.g. N,N-Di(1-naphthyl)-N,N-diphenyl-(1,1-biphenyl)-4,4-diamine (NPB)). In some embodiments, HTL110 and HIL 108 can include material similar or different from each other. In some embodiments, HTL 110 can be deposited on HIL 108 by, for example, spin coating, inkjet printing, slot die coating, nozzle printing, contact printing, a suitable solution printing technology, roll-to-roll processing, thermal evaporation, or a suitable vapor deposition technology.

Optionally, EBL 112 can be formed on HTL 110 as an intervening layer between EML 114 and HTL 110. EBL 112 can be configured to block electrons from escaping EML 114 by acting as a large energy barrier between HTL 110 and EML 114. EBL 112 can include p-type semiconductor materials that have a shallow conduction band, such as, for example, carbazole and triphenylene based organic compounds. In some embodiments, EBL 112 can be deposited on HTL 110 by, for example, spin coating, inkjet printing, slot die coating, nozzle printing, contact printing, a suitable solution printing technology, thermal evaporation, or a suitable vapor deposition technology.

Similar to EBL 112, HBL 116 can be optionally formed on EML 114 as an intervening layer between EML 114 and ETL 118. HBL 116 can be configured to block holes from escaping EML 114 by acting as a large energy barrier between ETL 118 and EML 114. HBL 116 can include n-type semiconductor materials that have a deep valence band, such as, for example, substituted benzimidazoles organic compounds. In some embodiments, HBL 116 can formed by, for example, spin coating, inkjet printing, slot die coating, nozzle printing, contact printing, a suitable solution printing technology, thermal evaporation, or a suitable vapor deposition technology.

Optionally, ETL 118 can be formed on HBL 116 or on EML 114 if HBL 116 is optionally not included. ETL 118 can be configured to facilitate the transportation of electrons from EIL 120 EML 114. In the absence of HBL 116, ETL 118 can be configured to block holes from escaping EML 114. In some embodiments, ETL 118 can include n-type, organic or inorganic semiconductor materials such as, for example, metal oxides or nanostructures of metal oxides (e.g., zinc oxide (ZnO), zinc magnesium oxide (ZnMgO), or titanium oxide ($TiO_2$)) or benzimidazole derivatives. In some embodiments, ETL 118 can be formed by, for example, spin coating, inkjet printing, slot die coating, nozzle printing, contact printing, a suitable solution printing technology, thermal evaporation, or a suitable vapor deposition technology. In some embodiments, ETL 118 can have a vertical dimension (e.g., thickness) along a Z-axis ranging from about 50 nm to about 100 nm (e.g., about 50 nm, about 60 nm, about 80 nm, or about 100 nm).

Optionally, EIL 120 can be formed on ETL 118 and can be configured to facilitate the injection of electrons from cathode 122 into ETL 118 by forming an ohmic or near ohmic contact with cathode 122. In some embodiments, EIL 120 can include n-type semiconductor materials, alkali metal salts (e.g., lithium flouride (LiF) or cesium carbonate ($CS_2CO_3$)), low work function metals (e.g., calcium (Ca), barium (Ba), magnesium (Mg), ytterbium (Yb), or cesium (Cs)), or organic compounds (e.g., polyfluorenes, polyethylenimine ethoxylated (PETE), or lithium-8-hydroxyquinolinolate (Liq)). In some embodiments, ETL 118 and EIL 120 can include material similar or different from each other. EIL 120 can be deposited on ETL 118 by, for example, spin coating, inkjet printing, slot die coating, nozzle printing, contact printing, a suitable solution printing technology, thermal evaporation, or a suitable vapor deposition technology.

Cathode 122 can be formed directly on EIL 120 or on EML 114 if EIL 120, ETL 118, and HBL 116 are optionally not included. Cathode 122 can be configured to inject electrons to device stack 103 when negatively biased during operation, as discussed above. In some embodiments, cathode 122 can have a vertical dimension (e.g., thickness) along a Z-axis ranging from about 100 nm to about 5 µm (e.g., about 250 nm, about 280 nm, about 300 nm, about 500 nm, about 1 µm, or about 5 µm). Cathode 122 can include electrically conductive and optically reflective materials such as, for example, aluminum (Al) or silver (Ag), according to some embodiments. The reflective materials of cathode 122 can help to reflect light towards substrate 102 and prevent light from being emitted through cathode 122. The light that is produced due to the release of photons after the recombination of electrons and holes in EML 114 (discussed above) can travel towards cathode 122 and substrate 102. The reflective materials of cathode 122 helps to redirect these photons towards substrate 102 for emission from FEL device 100. In some embodiments, cathode 122 and anode 104 can be optically transparent and light 101 can be emitted through both substrate 102 and cathode 122.

In some embodiments, cathode 122 can be formed by depositing and patterning the cathode materials on EIL 120. The deposition can be performed by, for example, sputtering, thermal evaporation, a suitable solution printing technology, or a suitable method for depositing electrically conductive and optically reflective materials. The patterning can be performed, for example, by an ink-jet printing process or by thermally evaporating the cathode material through a mask with desired pattern.

Encapsulation layer 124 can be formed directly on cathode 122 and on side surfaces (not shown in FIG. 1) of FEL device 100 and can be configured to provide mechanical and environmental protection to FEL device 100. In some embodiments, encapsulation layer 124 can include a coupling layer 124A and a barrier film 124B. The materials of coupling layer 124A and barrier film 124B can be selected to have barrier properties to provide mechanical and environmental protection along with flexibility and/or stretchability to FEL device 100. In some embodiments, the materials of coupling layer 124A and barrier film 124B can have a barrier property, such as a water vapor transmission rate (WVTR) ranging from about $10^{-5}$ $g/m^2$-day to about 10 $g/m^2$-day (e.g., about $10^{-5}$ $g/m^2$-day, about $10^{-4}$ $g/m^2$-day, about $10^{-3}$ $g/m^2$-day, about $10^{-2}$ $g/m^2$-day, or about $10^{-1}$ $g/m^2$-day) to provide protection from moisture. The WVTRs of coupling layer 124A and barrier film 124 can be similar or different from each other.

In some embodiments, coupling layer 124A can include a flexible pressure sensitive adhesive or other suitable flexible adhesive materials configured to couple barrier film 124B to cathode 122. Barrier film 124B can include a metal laminate, a metal foil, decorative colored backing, or other suitable flexible barrier materials, according to some embodiments. Coupling layer 124A and barrier film 124B can be optically transparent, reflective, or opaque.

In some embodiments, coupling layer 124A can have a vertical dimension (e.g., thickness) along a Z-axis ranging from about 20 µm to about 30 µm (e.g., about 20 µm, about 25 µm, or about 30 µm). In some embodiments, barrier film 124B can have a vertical dimension (e.g., thickness) along a Z-axis ranging from about 10 µm to about 150 µm (e.g., about 10 µm, about 12 µm, about 75 µm, about 100 µm, about 125 µm, or about 150 µm). In some embodiments, the vertical dimensions of barrier film 124B and substrate 102 along a Z-axis can similar or different from each other.

The vertical dimensions of coupling layer 124A and barrier film 124B can be selected to reduce stretching or compression of device stack 103, which could lead to device failure due to cracking or buckling of layers or contacts. The vertical dimensions of encapsulation layer 124 and substrate 102 can be selected such that the tensile and/or compressive forces encountered during bending of FEL device 100 can be substantially limited within encapsulation layer 124 and/or substrate 102 and do not extend to the layers of device stack 103 of FEL device 100. As such, the layers of device stack 103 can be in a neutral plane during bending of FEL device 100. The neutral plane can be defined as a plane that is substantially free of a tensile or compressive force.

In some embodiments, a buffer layer (not shown in FIG. 1) can be deposited between cathode 122 and coupling layer 124A. The buffer layer can include an oxide material and have a WVTR ranging from about $10^{-5}$ $g/m^2$-day to about 10 $g/m^2$-day (e.g., about $10^{-5}$ $g/m^2$-day, about $10^{-4}$ $g/m^2$-day, about $10^{-3}$ $g/m^2$-day, about $10^{-2}$ $g/m^2$-day, or about $10^{-1}$ $g/m^2$-day) to provide additional environmental protection. The buffer layer can have a WVTR similar or different from coupling layer 124A and/or barrier film 124B.

In some embodiment, FEL 100 can include an encapsulation layer (not shown) on substrate 102. This substrate side encapsulation layer can be similar to encapsulation layer 124, except its coupling layer and barrier film can be optically transparent to allow light 101 to be emitted through substrate 102 without substantially absorbing light 101. Its coupling layer can be configured to couple its barrier film to surface 102s of substrate 102.

FIG. 2 illustrates a schematic of a cross-sectional view of a top emitting FEL device 200, according to some embodiments. The above discussion of FEL device 100 applies to FEL device 200 unless mentioned otherwise. FEL device 200 can be similar to FEL device 100, except FEL device 200 emits light 101 through cathode 222 and not through substrate 202. Thus, unlike FEL device 100, FEL device 200 can include an opaque and/or reflective substrate 202, a transparent cathode 222, and a transparent encapsulation layer 224 disposed on cathode 222.

The above discussion of substrate 202 applies to substrate 102, except the materials of substrate 202 can be opaque and/or reflective. The reflective materials of substrate 202 can help to reflect light towards cathode 222 and prevent light from being emitted through substrate 202. The light that is produced due to the release of photons after the recombination of electrons and holes in EML 114 (discussed above) can travel towards cathode 222 and substrate 202. The reflective materials of substrate 202 can help to redirect these photons towards cathode 222 for emission from FEL device 200. In some embodiments, additionally or alternatively, anode 104 can be reflective and include electrically conductive and optically reflective layers such as, for example, aluminum (Al) or silver (Ag).

The above discussion of cathode 122 applies to cathode 222, except cathode 222 can include electrically conductive and optically transparent layers such as, for example, a layer of ITO, a multilayer stack of ITO/Ag/ITO, or ultrathin metal films, such as a thin layer of Ag having a thickness of about 10 nm.

The above discussion of encapsulation layer 124 applies to encapsulation layer 224, unless mentioned otherwise. Encapsulation layer 224 can include coupling layer 224A and barrier film 224B configured to provide mechanical and environmental protection along with flexibility and/or stretchability to FEL device 200. Coupling 224A and barrier film 224B can be similar to coupling layer 124A and barrier film 124B, respectively, except coupling layer 224A and barrier film 224B can be optically transparent to allow light 101 to be emitted through cathode 222 without substantially absorbing light 101.

In some embodiment, FEL 200 can include an encapsulation layer (not shown) on substrate 202. This substrate side encapsulation layer can be similar to encapsulation layer 124 of FIG. 1, except its coupling layer can be configured to couple its barrier film to surface 202s of substrate 202.

Figure 3:
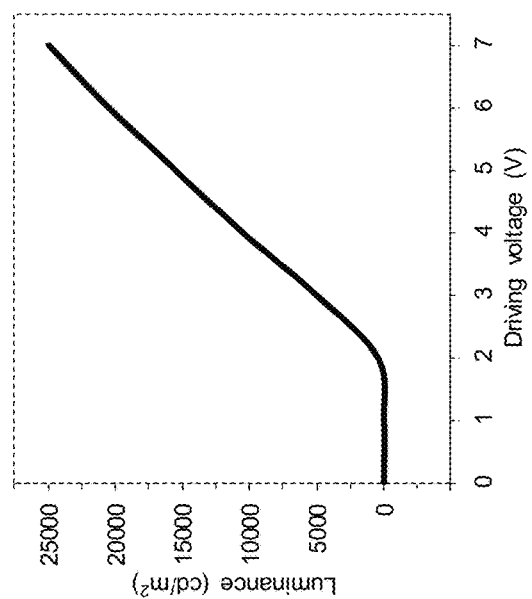
FIG. 3 illustrates luminance vs. voltage characteristics of a FEL device, according to some embodiments.
Figure 4:
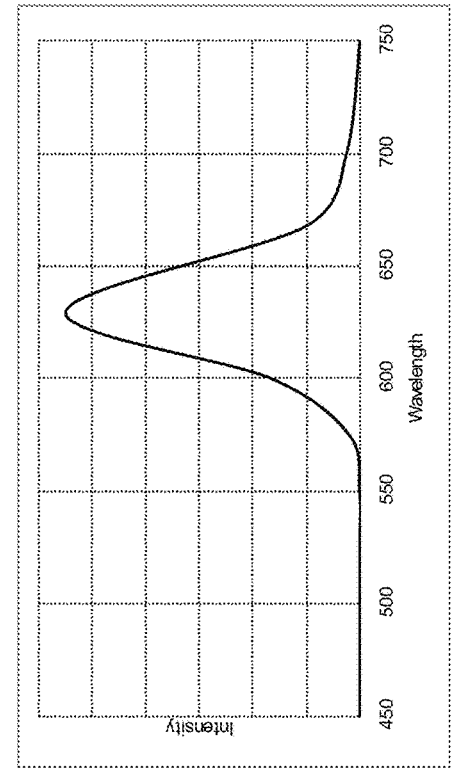
FIG. 4 illustrates an electroluminescence spectrum of a FEL device with a Cd-free NS-based EML, according to some embodiments.

FIGS. 3-4 illustrates example device characteristics of a Cd-free NS-based FEL device, such as FEL devices 100 and 200. The luminance vs voltage plot of FIG. 3 shows that the FEL device can achieve a light brightness of about 25,000 cd/m² at a low driving voltage of 7V. Such brightness can be achieved for a light with a primary electroluminescence peak wavelength of about 630 nm emitted by the FEL device, as illustrated by the electroluminescence property of the FEL device in FIG. 4.

Figure 5:
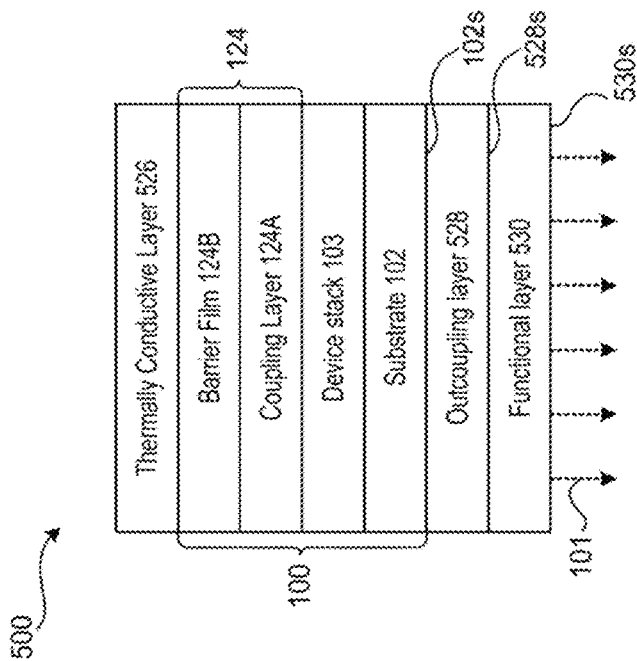
FIG. 5 is a schematic of a cross-sectional view of a FEL device with a thermally conductive layer and a light outcoupling layer, according to some embodiments.

FIG. 5 illustrates a schematic of a cross-sectional view of a bottom emitting FEL device 500, according to some embodiments. FEL device 500 can include FEL device 100 with a thermally conductive layer 526, an outcoupling layer 528, and a functional layer 530. Elements in FIG. 5 with the same annotations as elements in FIG. 1 are described above.

Thermally conductive layer 526 can be disposed on barrier film 124A and can be configured to dissipate heat away from the light emitting surfaces (e.g., surfaces 102s, 528s, and/or 530s) of FEL device 500. The heat can be generated by FEL device 100 during operation. In some embodiments, thermally conductive layer 526 can help to prevent FEL device 500 from heating a target site when used, for example, in photomedical applications, where the target site can be a treatment site on the human skin or inside the human body. In some embodiments, thermally conductive layer 526 can include a layer of metal foil, a metal mesh structured layer, or other suitable layers of flexible thermally conductive materials. In some embodiments, thermally conductive layer 526 can be deposited using spraying, painting, spin-coating, printing, transferring, or other suitable thermally conductive material deposition method. In some embodiments, thermally conductive layer 526 can have a vertical dimension (e.g., thickness) along a Z-axis ranging from about 10 nm to about 150 nm (e.g., about 20 nm, about 50 nm, or about 150 nm) or less than about 150 nm.

In some embodiments, thermally conductive layer 526 is not included in FEL device 500, if the material of barrier film 124B has thermal conductive properties in addition to the barrier properties discussed above with reference to FIG. 1. In such case, barrier film 124B can be configured to dissipate heat away from the light emitting surfaces of FEL device 500.

Outcoupling layer 528 can be disposed directly on surface 102s of substrate 102 and can be configured to extract light from FEL device 500. The light extraction can include providing directivity to light emitting from device 103 through substrate 102 and preventing total internal reflection of the light within substrate 102. Without an outcoupling layer 528, some portions of the light emitting through substrate 102 into air can be totally internally reflected within substrate 102 because of the higher refractive index of substrate 102 compared to air. If light in a higher refractive index material (e.g., substrate 102) encounters an interface with a lower refractive index material (e.g., air) at an angle larger than the critical angle, instead of passing out of the higher refractive index material, the light can be bent back into the higher refractive index material. This can be referred to as total internal reflection. Such loss of emitted light through total internal reflection within substrate 102 can reduce the brightness of the light emitted from substrate 102. Thus, outcoupling layer 528 can help to enhance the brightness of light 101 emitted from FEL device 500, and also to increase light extraction from FEL device 500.

In some embodiments, outcoupling layer 528 can include a textured surface formed on surface 102 using, for example, sandblasting. In some embodiments, outcoupling layer 528 can include an elastic or polymeric material, such as silicone gel or other suitable materials that in addition to light extraction can help to eliminate any air gaps between FEL device 500 and a surface (e.g., human skin) on which the emitting surface (e.g., surfaces 528s or 530s) of FEL device 500 is substantially conformally applied. Eliminating air gaps at the interface between FEL 500 and the applied surface can help to prevent loss of emitted light through total internal reflection of some portions of the emitted light within outcoupling layer 528 because of the higher refractive index of outcoupling layer 528 compared to air. In some embodiments, outcoupling layer 528 having polymeric material, such as silicone gel can provide thermal insulation to a surface (e.g., human skin) illuminated by light 101 from FEL device 500. The thermal insulation can be from heat generated by FEL device 500. In some embodiments, outcoupling layer 528 can have a vertical dimension (e.g., thickness) along a Z-axis ranging from about 10 μm to about 150 μm (e.g., about 20 μm, about 50 μm, or about 150 μm).

Optionally, functional layer 530 can be included in FEL device 500. Functional layer 530 can be disposed on surface 528s of outcoupling layer 528 and be configured to diffuse emitted light 101 substantially uniformly across surface 530s and as such, a substantially uniform distribution of light can be delivered on a surface (e.g., human skin) during an application of FEL device 500 (e.g., photomedical applications). In some embodiments, functional layer 530 can include a fabric or other similar material, which can include pre-coated topical treatment for applications in photomedicine.

In some embodiment, FEL 500 can include an encapsulation layer (not shown) on substrate 102, functional layer 530, or on outcoupling layer 528 if functional layer 530 optionally not included. This encapsulation layer can be similar to encapsulation layer 124, except its coupling layer and barrier film can be optically transparent to allow light 101 to be emitted through functional layer 530 or outcoupling layer 528 without substantially absorbing light 101. Its coupling layer can be configured to couple its barrier film to surface 530s, or on 528s if functional layer 530 optionally not included.

Similar to FEL device 500, FEL device 200 can include outcoupling layer 528 disposed on substrate 202 and optionally, functional layer 530 disposed on outcoupling layer 528. Also, FEL device 200 can include a thermally conductive layer on barrier film 224A similar to thermally conductive layer 526, except the thermally conductive layer of FEL device 200 can be optically transparent to allow light 101 to be emitted through cathode 222 and encapsulation layer 224 without substantially absorbing light 101.

Figures 6, 7:
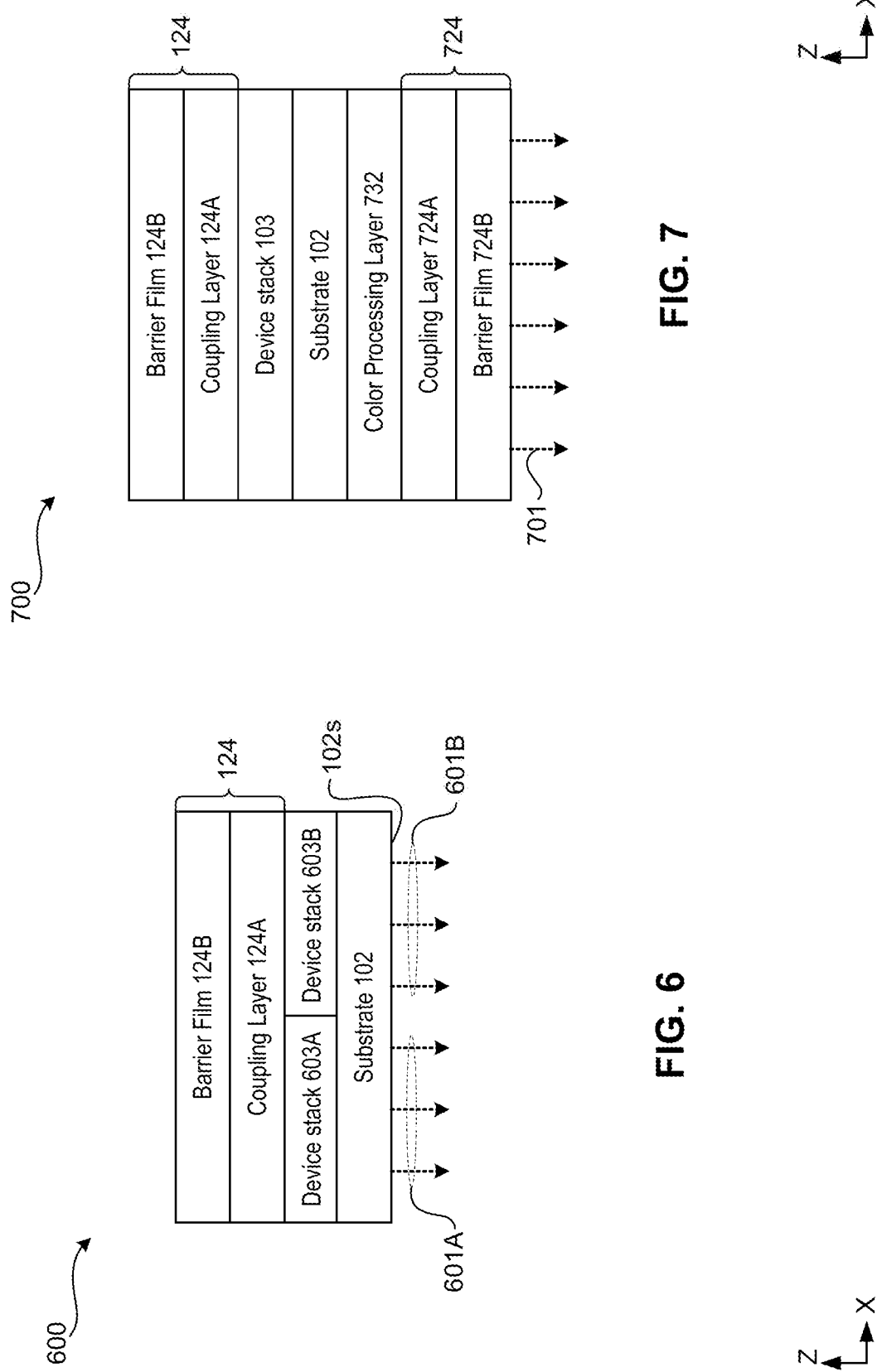
FIG. 6 is a schematic of a cross-sectional view of a FEL device with a plurality of EMLs, according to some embodiments.
FIG. 7 is a schematic of a cross-sectional view of a FEL device with a color processing layer and encapsulation layers, according to some embodiments.

FIG. 6 illustrates a schematic of a cross-sectional view of a bottom emitting FEL device 600, according to some embodiments. The above discussion of FEL device 100 applies to FEL device 600, unless mentioned otherwise. Elements in FIG. 6 with the same annotations as elements in FIG. 1 are described above. FEL device 600 can be similar to FEL device 100, except FEL device 600 includes two adjacent device stacks 603A-603B instead of one device stack 103 as shown in FIG. 1. The above discussion of device stack 103 applies to each of device stacks 603A-603B, unless mentioned otherwise. Device stacks 603A-603B can be configured to simultaneously emit light 601A-601B, respectively, with primary emission peak wavelengths different from each. The wavelengths are within the visible or IR spectrum. Even though two adjacent device stacks 603A-603B are shown in FIG. 6, FEL device 600 can have two or more adjacent device stacks that can be configured to simultaneously emit light with primary emission peak wavelengths different from each.

Except for EMLs of device stacks 603A-603B, the layers of device stacks 603A-603B can be similar to each other. The above discussion of EML 114 applies to EML of each device stack 603A-603B, unless mentioned otherwise. The EMLs of device stacks 603A-603B can be configured to simultaneously emit light 601A and 601B, respectively, with primary emission peak wavelengths different from each other. For example, the primary emission peak wavelengths of lights 601A-601B can be at wavelengths 660 nm and 860 nm, respectively. The primary emission peak wavelengths can be within the visible or IR spectrum. The size and material of NSs in the EMLs of device stacks 603A-603B can be selected to emit light 601A and 601B, respectively. In some embodiments, except for the EMLs, device stacks 603A-603B can share anode 104, HIL 108, HTL 110, EBL 112, HBL 116, ETL 118, EIL 120, and/or cathode 122 between them.

In some embodiments, FEL device 200 can have device stacks 603A-603B instead of device stack 103 and can be configured to simultaneously emit light 601A-601B, respectively, through cathode 222 and encapsulation layer 224. Similar to FEL device 500, FEL device 600 can include thermally conductive layer 526 on barrier film 124B, outcoupling layer 528 on substrate 102, and optional functional layer 530 on outcoupling layer 528.

FIG. 7 illustrates a schematic of a cross-sectional view of a bottom emitting FEL device 700, according to some embodiments. The above discussion of FEL device 100 applies to FEL device 700, unless mentioned otherwise. Elements in FIG. 7 with the same annotations as elements in FIG. 1 are described above. FEL device 700 can be similar to FEL device 100, except FEL device 700 includes a color processing layer 732 disposed on substrate 102 and an encapsulation layer 724 disposed on color processing layer 732. Color processing layer 732 can be configured to process light 101 (not shown in FIG. 7; shown in FIG. 1) and produce processed light 701. Color of processed light 701 can include one or more primary emission peak wavelengths within the visible and IR spectra. The primary emission peak wavelength of light 101 can be shorter than the primary emission peak wavelength of light 701. For example, if the primary emission peak wavelengths of light 101 is 450 nm and/or 600 nm, the primary emission peak wavelengths of light 701 can be 600 nm and/or 800 nm, respectively.

Color processing layer 732 can include one or more phosphor films (e.g., NS film 1000 described with reference to FIG. 10). The one or more phosphor films can have luminescent nanostructures (NS) such as QDs (e.g., NS 900 described with reference to FIG. 9). In some embodiments, EML 114 (not shown in FIG. 7; shown in FIG. 1) of device 103 can produce blue light 101 and in order to emit processed red or green light 701, the one or more phosphor films can produce the processed red or green light 701 by down converting blue light 101. In some embodiments, the one or more phosphor films can include scattering material (e.g., particles having diameters ranging from about 100 nm to about 500 μm) of titanium oxide, zinc oxide, zinc sulfide, silicone, or a combination thereof, with the luminescent NSs.

In some embodiments, color processing layer 732 can be a pre-patterned layer formed by, for example, inkjet printing, nozzle printing, contact printing, or a suitable solution printing technology and can be self-adhesive or can be coupled to substrate 102 using a coupling layer similar to coupling layer 124A.

Encapsulation layer 724 can include coupling layer 724A and barrier film 724B similar to coupling layer 124A and barrier film 124B, respectively, except coupling layer 724A and barrier film 724B can be optically transparent to allow light 701 to be emitted without substantially absorbing light 701.

In some embodiments, FEL device 200 can have color processing layer 732 between cathode 222 and encapsulation layer 224 and can be configured to process light 101 and produce processed light 701 through cathode 222 and encapsulation layer 224. Similar to FEL device 500, FEL device 700 can include thermally conductive layer 526 on barrier film 124B, outcoupling layer 528, and optional functional layer 530. In FEL device 700, outcoupling layer 528 can be interposed between substrate 102 and color processing layer 732, between color processing layer 732 and encapsulation layer 724, or on barrier film 724B. Functional layer 530 can be optionally disposed on barrier film 724B.

The elements described in this disclosure as being on or over other elements can be directly on with the other elements or can have intervening layers unless mentioned otherwise. It should be noted that even though some of the elements of FIGS. 1-2 and 5-7 are shown to have similar dimensions along X-, Y-, and/or Z-axes with respect to each other, each of these elements can have dimensions different from each other in one or more directions, without deviating from the scope or spirit of the invention.

Example Methods for Fabricating Flexible Electroluminescent Device

Figure 8:
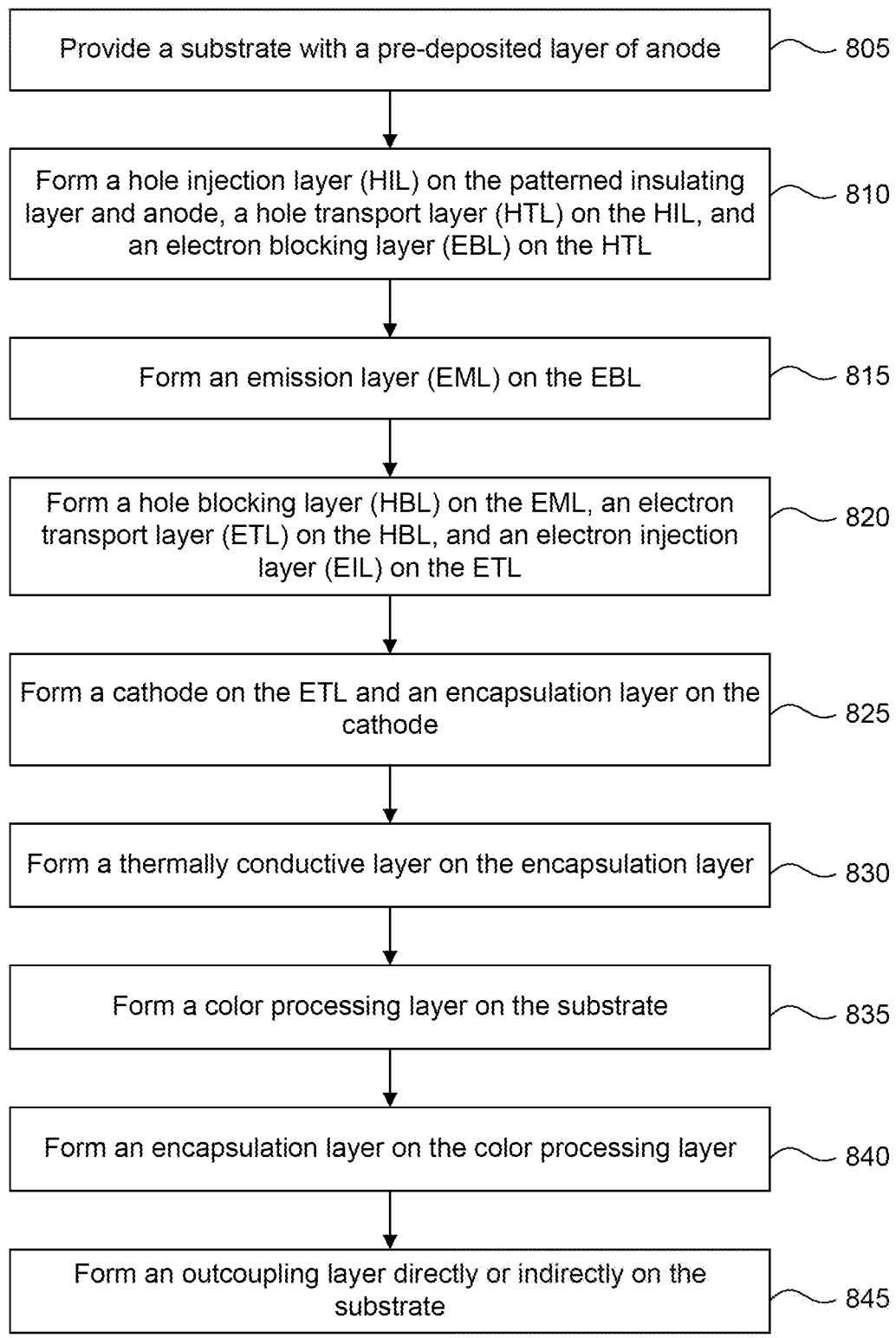
FIG. 8 is a flow diagram of a method for fabricating a FEL device with an encapsulation layer, according to some embodiments.

FIG. 8 is a flow diagram of an example method 800 for fabricating FEL devices 100, 200, 500, 600, and/or 700, according to some embodiments. Steps can be performed in a different order or not performed depending on specific applications. It should be noted that method 800 may not produce a complete FEL device. Accordingly, it is understood that additional processes can be provided before, during, and after method 800, and that some other processes may only be briefly described herein.

In step 805, a flexible substrate with a pre-deposited layer of anode is provided. For example, as shown in FIG. 1, anode 104 can be disposed on substrate 102. In some embodiments, substrate 102 can be flexible and optically transparent and can include a polymeric material, such as plastic, polyethylene terephthalate (PET), or other suitable flexible polymeric materials. In some embodiments, substrate 102 can include ultrathin silver, silver mesh, silver nanowires, conductive organic polymer, or other suitable conductive materials that does not include indium-tin-oxide (ITO). In some embodiments, the materials of the flexible substrate (e.g., substrate 202 of FIG. 2) can be opaque and/or reflective when FEL device (e.g., FEL device 200) can be configured to emit light 101 through cathode 222 instead of through substrate 102. Anode 104 can include electrically conductive and optically transparent materials such as, for example, indium-tin-oxide (ITO), according to some embodiments. In some embodiments, a PET plastic substrate with pre-deposited ITO layer can be used to as the starting substrate to deposit the other layers of FEL device 100 in subsequent processing steps.

In step 810, a hole injection layer (HIL), a hole transport layer (HTL), and an electron block layer (EBL) is formed. For example, as shown in FIG. 1, HIL 108 can be disposed on anode 104. HTL 110 can be disposed on HIL 108 and EBL 112 can be disposed on HTL 110. HIL 108, HTL 110, and EBL 112 can each be deposited on its underlying layer by, for example, spin coating, inkjet printing, slot die coating, nozzle printing, contact printing, a suitable solution printing technology, roll-to-roll processing, thermal evaporation, or a suitable vapor deposition technology. In some embodiments, HIL 108 can include PEDOT (poly(3,4-ethylenedioxythiophene)) doped with PSS (poly(styrene sulfonate)) and HTL 110 can include TFB (poly[(9,9-dioctylfluorenyl-2,7-diyl)-co-(4,4'(N-(4-sec-butylphenyl))) diphenylamine]).

In step 815, an emission layer (EML) is formed on the EBL. For example, as shown in FIG. 1, EML 114 can be disposed on EBL 112. In some embodiments, EML 114 can be deposited on EBL 112 by, for example, spin coating, inkjet printing, slot die coating, nozzle printing, contact printing, a suitable solution printing technology, thermal evaporation, or a suitable vapor deposition technology. In some embodiments, EML 114 can include indium phosphide (InP) based QDs having a diameter of about 20 nm and can be configured to emit a primary emission peak wavelength in the red wavelength region.

In some embodiments, step 810 can be an optional step and step 805 can be followed by step 815, where the EML is formed on the anode.

In step 820, a hole blocking layer (HBL), an electron transport layer (ETL), and an electron injection layer (EIL) is formed. For example, as shown in FIG. 1, HBL 116 can be disposed on EML 114, ETL 118 can be disposed on HBL 116, and EIL 120 can be disposed on ETL 118. HBL 116, ETL 118, and EIL 120 can each be deposited on its underlying layer by, for example, spin coating, inkjet printing, slot die coating, nozzle printing, contact printing, a suitable solution printing technology, thermal evaporation, or a suitable vapor deposition technology. In some embodiments, ETL 118 can include zinc magnesium oxide (ZnMgO).

In step 825, a cathode is formed on the EIL and an encapsulation layer is formed on the cathode. For example, as shown in FIG. 1, cathode 122 can be disposed on EIL 120 and encapsulation layer 124 can be disposed on cathode 122. Cathode 122 can include electrically conductive and optically reflective materials such as, for example, aluminum (Al) or silver (Ag), according to some embodiments. In some embodiments, cathode 122 can be formed by depositing the cathode materials on EIL 120 by, for example, sputtering, thermal evaporation, a suitable solution printing technology, or a suitable method for depositing electrically conductive and optically reflective materials. In some embodiments, the materials of the cathode (e.g., cathode 222 of FIG. 2) can include electrically conductive and optically transparent layers such as, for example, a layer of ITO, a multilayer stack of ITO/Ag/ITO, or ultrathin metal films, such as a thin layer of Ag having a thickness of about 10 nm when FEL device (e.g., FEL device 200) can be configured to emit light 101 through cathode 222 instead of through substrate 102.

In some embodiments, step 820 can be an optional step and step 815 can be followed by step 825, where the cathode is formed on the EML.

Encapsulation layer 124 can be formed directly on cathode 122. In some embodiments, encapsulation layer 124 can include a coupling layer 124A and a barrier film 124B. The materials of coupling layer 124A and barrier film 124B can be selected to have barrier properties, such as a water vapor transmission rate (WVTR) ranging from about $10^{-5}$ g/m$^2$-day to about 10 g/m$^2$-day (e.g., about $10^{-5}$ g/m$^2$-day, about $10^{-4}$ g/m$^2$-day, about $10^{-3}$ g/m$^2$-day, about $10^{-2}$ g/m$^2$-day, or about $10^{-1}$ g/m$^2$-day). The WVTRs of coupling layer 124A and barrier film 124 can be similar or different from each other.

In some embodiments, coupling layer 124A can include a flexible pressure sensitive adhesive (PSA) or other suitable flexible adhesive materials configured to couple barrier film 124B to cathode 122. Coupling layer 124A can be applied on cathode 122 followed by barrier film 124B on coupling layer 124A. Barrier film 124B can include a metal laminate, a metal foil, decorative colored backing, or other suitable flexible barrier materials, according to some embodiments. Coupling layer 124A and barrier film 124B can be optically transparent, reflective, or opaque.

In step 830, a thermally conductive layer is formed on the encapsulation layer. For example, as shown in FIG. 5, thermally conductive layer 526 can be disposed on barrier film 124A. In some embodiments, thermally conductive layer 526 can include a layer of metal foil, a metal mesh structured layer, or other suitable layers of flexible thermally conductive materials. In some embodiments, thermally conductive layer 526 can be deposited using spraying, painting, spin-coating, printing, transferring, or other suitable thermally conductive material deposition method. In some embodiments, thermally conductive layer 526 can have a vertical dimension (e.g., thickness) along a Z-axis ranging from about 10 nm to about 150 nm (e.g., about 20 nm, about 50 nm, or about 150 nm) or less than about 150 nm.

In step 835, a color processing layer is formed on the substrate. For example, as shown in FIG. 7, color processing layer 732 can be disposed on substrate 102. In some embodiments, color processing layer 732 can be a pre-patterned layer formed by, for example, inkjet printing, nozzle printing, contact printing, or a suitable solution printing technology and can be self-adhesive or can be coupled to substrate 102 using a coupling layer similar to coupling layer 124A.

In step 840, an encapsulation layer is formed on the color processing layer. For example, as shown in FIG. 7, encapsulation layer 724 can be disposed on color processing layer 732. Encapsulation layer 724 can include coupling layer 724A and barrier film 724B similar to coupling layer 124A and barrier film 124B, respectively, except coupling layer 724A and barrier film 724B can be optically transparent to allow light 701 to be emitted without substantially absorbing light 701.

In step 845, an outcoupling layer is formed directly or indirectly on the substrate. For example, as shown in FIG. 5, outcoupling layer 528 can be directly disposed on substrate 102. In some embodiments, as discussed with reference to FIG. 7, outcoupling layer 528 can be disposed on the color processing layer 732 or on barrier film 724B, thus, indirectly disposed on the substrate.

In some embodiments, step 830 can be performed before or after steps 835, 840, or 845.

Example Embodiments of a Barrier Layer Coated Nanostructure

Figure 9:
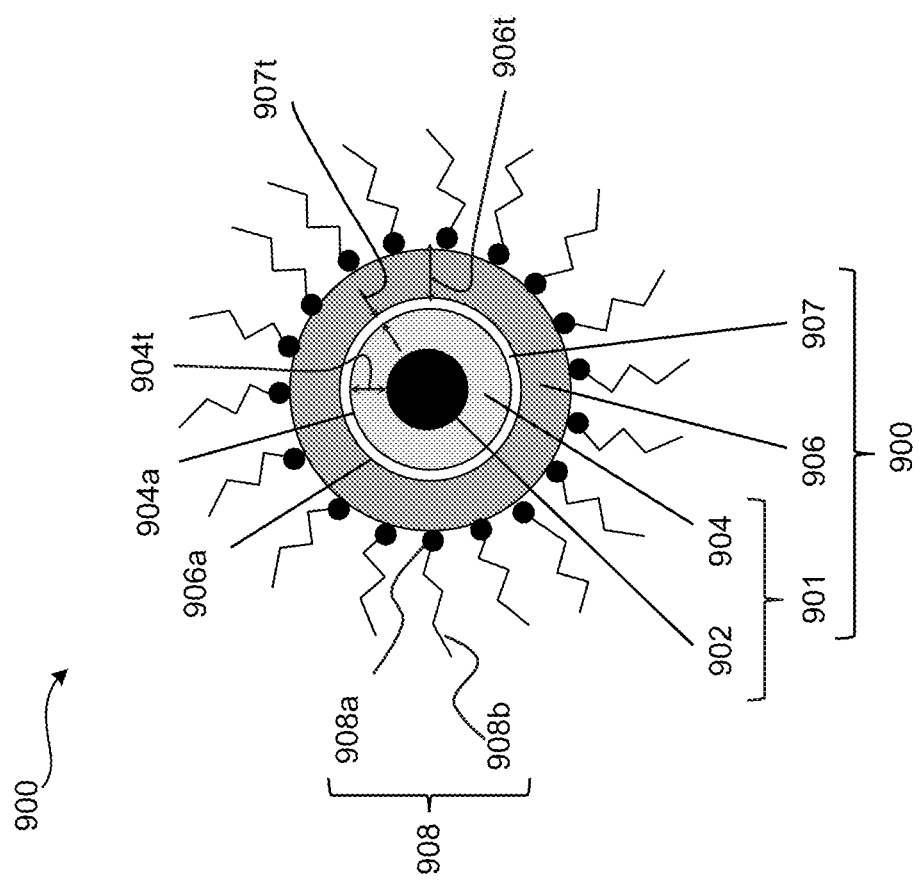
FIG. 9 is a schematic of a cross-sectional view of a nanostructure (NS), according to some embodiments.

FIG. 9 illustrates a cross-sectional structure of a barrier layer coated luminescent nanostructure (NS) 900, according to an embodiment. In some embodiments, a population of NS 900 can be included in light emitting layers of EML 114. Barrier layer coated NS 900 includes a NS 901 and a barrier layer 906. NS 901 includes a core 902 and a shell 904. Core 902 includes a semiconducting material that emits light. Examples of the semiconducting material for core 902 include indium phosphide (InP), cadmium selenide (CdSe), zinc sulfide (ZnS), lead sulfide (PbS), indium arsenide (InAs), indium gallium phosphide, (InGaP), cadmium zinc selenide (CdZnSe), zinc selenide (ZnSe) and cadmium telluride (CdTe). Any other II-VI, III-V, tertiary, or quaternary semiconductor structures that exhibit a direct band gap can be used as well. In an embodiment, core 902 can also include one or more dopants such as metals, halogens, and alloys, to provide some examples. Examples of metal dopant can include, but not limited to, zinc (Zn), Copper (Cu), aluminum (Al), platinum (Pt), chrome (Cr), tungsten (W), palladium (Pd), or a combination thereof. Examples of a halogen dopant can include, but are not limited to, fluorine (F), chlorine (Cl), bromine (Br) or iodine (I). The presence of one or more dopants in core 902 can improve structural, electrical, and/or optical stability and QY of NS 901 compared to undoped NSs.

Core 902 can have a size of less than 20 nm in diameter, according to an embodiment. In another embodiment, core 902 can have a size between about 1 nm and about 10 nm in diameter. The ability to tailor the size of core 902, and consequently the size of NS 901 in the nanometer range enables photoemission coverage in the entire optical spectrum. In general, the larger NSs emit light towards the red end of the spectrum, while smaller NSs emit light towards the blue end of the spectrum. This effect arises as larger NSs have energy levels that are more closely spaced than the smaller NSs. This allows the NS to absorb photons containing less energy, i.e. those closer to the red end of the spectrum.

Shell 904 surrounds core 902 and is disposed on outer surface of core 902. Shell 904 can include, but is not limited to, cadmium sulfide (CdS), zinc cadmium sulfide (ZnCdS), zinc selenide sulfide (ZnSeS), and zinc sulfide (ZnS). In an embodiment, shell 904 can have a thickness 904t, for example, one or more monolayers. In other embodiments, shell 904 can have a thickness 904t between about 1 nm and about 10 nm. Shell 904 can be utilized to help reduce the lattice mismatch with core 902 and improve the QY of NS 901. Shell 904 can also help to passivate and remove surface trap states, such as dangling bonds, on core 902 to increase QY of NS 901. The presence of surface trap states can provide non-radiative recombination centers and contribute to lowered emission efficiency of NS 901.

In alternate embodiments, NS 901 can include a second shell disposed on shell 904, or more than two shells surrounding core 902, without departing from the spirit and scope of the present invention. In an embodiment, the second shell can be one or more monolayers thick and is typically, though not required, also a semiconducting material. Second shell can provide protection to core 902. Second shell material can be zinc sulfide (ZnS), although other materials can be used, and dopants can be included as well, without deviating from the scope or spirit of the invention.

Barrier layer 906 can be configured to form a coating on NS 901. In an embodiment, barrier layer 906 is disposed on and in substantial contact with outer surface 904a of shell 904. In embodiments of NS 901 having one or more shells, barrier layer 906 can be disposed on and in substantial contact with the outermost shell of NS 901. In an example embodiment, barrier layer 906 can be configured to act as a spacer between NS 901 and one or more NSs in, for example, a solution, a composition, and/or a film having a plurality of NSs, where the plurality of NSs can be similar to NS 901 and/or barrier layer coated NS 900. In such NS solutions, NS compositions, and/or NS films, barrier layer 906 can help to prevent aggregation of NS 901 with adjacent NSs. Aggregation of NS 901 with adjacent NSs can lead to increase in size of NS 901 and consequent reduction or quenching in the optical emission properties of the aggregated NS (not shown) including NS 901. In further embodiments, barrier layer 906 provides protection to NS 901 from, for example, moisture, air, and/or harsh environments (e.g., high temperatures and chemicals used during lithographic processing of NSs and/or during manufacturing process of NS based devices) that can adversely affect the structural and optical properties of NS 901.

Barrier layer 906 can include one or more materials that are amorphous, optically transparent and/or electrically inactive. Suitable barrier layers include inorganic materials, such as, but not limited to, inorganic oxides, halides, and/or nitrides. Examples of materials for barrier layer 906 include oxides and/or nitrides of Al, Ba, Ca, Mg, Ni, Si, Ti, or Zr, according to various embodiments. Barrier layer 906 can have a thickness 906t ranging from about 0.5 nm to about 15 nm in various embodiments.

Barrier layer coated NS 900 can additionally or optionally include a buffer layer 907 configured to form a buffered coating on NS 901. In an embodiment, buffer layer 107 is disposed on shell 904 and in substantial contact with outer surface 904a of shell 904 and inner surface 906a of barrier layer 906. Buffer layer 107 can be configured to act as a buffer between NS 901 and chemicals used during subsequent processing on NS 901, such as, for example, formation of barrier layer 906 on NS 901.

Buffer layer 907 can help to substantially reduce and/or prevent quenching in the optical emission properties of NS 901 due to reaction with chemicals used during subsequent processing on NS 901. Buffer layer 907 can include one or more materials that are amorphous, optically transparent and/or electrically active. The one or more materials of buffer layer 907 can include inorganic or organic materials. Examples of inorganic materials for buffer layer 907 include oxides and/or nitrides of metals, according to various embodiments. Examples for metal oxides include ZnO, $TiO_2$, $In_2O_3$, $Ga_2O_3$, $SnO_2$, $Al_2O_3$, or MgO. Buffer layer 907 can have a thickness 907t ranging from about 1 nm to about 5 nm in various embodiments.

As illustrated in FIG. 9, barrier layer coated NS 900 can additionally or optionally include a plurality of ligands or surfactants 908, according to an embodiment. Ligands or surfactants 908 can be adsorbed or bound to an outer surface of barrier layer coated NS 900, such as on an outer surface of barrier layer 906, or outer surface of shell 904 or second shell, according to an embodiment. The plurality of ligands or surfactants 908 can include hydrophilic or polar heads 908a and hydrophobic or non-polar tails 908b. The hydrophilic or polar heads 908a can be bound to barrier layer 906. The presence of ligands or surfactants 908 can help to separate NS 900 and/or NS 901 from other NSs in, for example, a solution, a composition, and/or a film during their formation. If the NSs are allowed to aggregate during their formation, the quantum efficiency of NSs such as NS 900 and/or NS 901 can drop. Ligands or surfactants 908 can also be used to impart certain properties to barrier layer coated NS 900, such as hydrophobicity to provide miscibility in non-polar solvents, or to provide reaction sites (e.g., reverse micellar systems) for other compounds to bind.

A wide variety of ligands exist that can be used as ligands 908. In some embodiments, the ligand is a fatty acid selected from lauric acid, caproic acid, myristic acid, palmitic acid, stearic acid, and oleic acid. In some embodiments, the ligand is an organic phosphine or an organic phosphine oxide selected from trioctylphosphine oxide (TOPO), trioctylphosphine (TOP), diphenylphosphine (DPP), triphenylphosphine oxide, and tributylphosphine oxide. In some embodiments, the ligand is an amine selected from dodecylamine, oleylamine, hexadecylamine, and octadecylamine. In some embodiments, the ligand is trioctylphosphine (TOP). In some embodiments, the ligand is oleylamine. In some embodiments, the ligand is a thiol, for example, octanethiol. In some embodiments, the ligand is diphenylphosphine. In some embodiments, the ligand is a neutral salt of any of these fatty acids, or a chalcogenide of any of these amines, phosphines, or phosphine oxides, for example, zinc oleate, zinc laurate, TOP-selenide, or TOP-sulfide.

A wide variety of surfactants exist that can be used as surfactants 908. Nonionic surfactants can be used as surfactants 908 in some embodiments. Some examples of nonionic surfactants include polyoxyethylene (5) nonylphenylether (commercial name IGEPAL CO-520), polyoxyethylene (9) nonylphenylether (IGEPAL CO-630), octylphenoxy poly (ethyleneoxy)ethanol (IGEPAL CA-630), polyethylene glycol oleyl ether (Brij 93), polyethylene glycol hexadecyl ether (Brij 52), polyethylene glycol octadecyl ether (Brij S10), polyoxyethylene (10) isooctylcyclohexyl ether (Triton X-100), and polyoxyethylene branched nonylcyclohexyl ether (Triton N-101).

Anionic surfactants can be used as surfactants 908 in some embodiments. Some examples of anionic surfactants include sodium dioctyl sulfosuccinate, sodium stearate, sodium lauryl sulfate, sodium monododecyl phosphate, sodium dodecylbenzenesulfonate, and sodium myristyl sulfate.

In some embodiments, NSs 901 and/or 900 can be synthesized to emit light in one or more various color ranges, such as red, orange, and/or yellow range. In some embodiments, NSs 901 and/or 900 can be synthesized to emit light in the green and/or yellow range. In some embodiments, NSs 901 and/or 900 can be synthesized emit light in the blue, indigo, violet, and/or ultra-violet range. In some embodiments, NSs 901 and/or 900 can be synthesized to have a primary emission peak wavelength between about 605 nm and about 650 nm, between about 510 nm and about 550 nm, or between about 300 nm and about 495 nm.

NSs 901 and/or 900 can be synthesized to display a high QY. In some embodiments, NSs 901 and/or 900 can be synthesized to display a QY between 80% and 100% or between 85% and 90%.

Thus, according to various embodiments, NSs 900 can be synthesized such that the presence of barrier layer 906 on NSs 901 does not substantially change or quench the optical emission properties of NSs 901.

Example Embodiments of a Nanostructure Film

Figure 10:
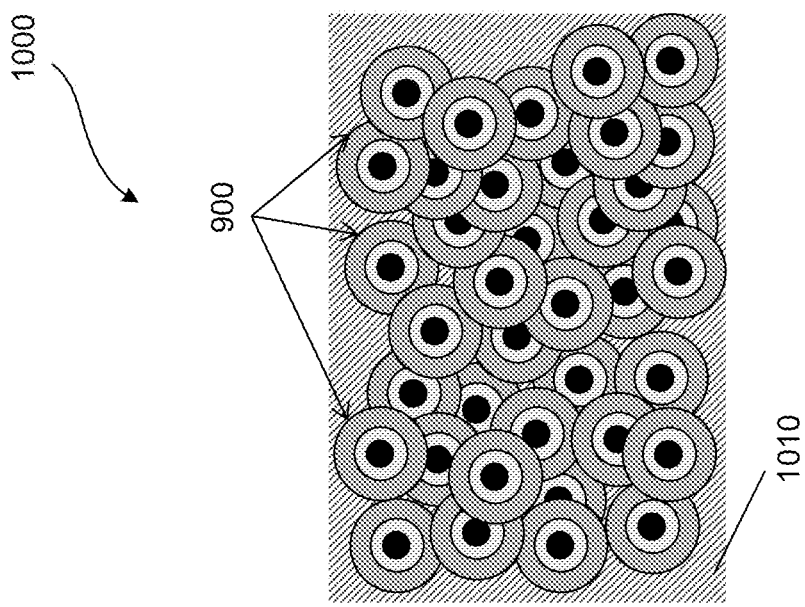
FIG. 10 is a schematic of a NS film, according to some embodiments.

FIG. 10 illustrates a cross-sectional view of a NS film 1000, according to an embodiment. In some embodiments, light emitting layers of EML 114 can be similar to NS film 1000.

NS film 1000 can include a plurality of barrier layer coated core-shell NSs 900 (FIG. 9) and a matrix material 1010, according to an embodiment. NSs 900 can be embedded or otherwise disposed in matrix material 1010, according to some embodiments. As used herein, the term "embedded" is used to indicate that the NSs are enclosed or encased within matrix material 1010. It should be noted that NSs 900 can be uniformly distributed throughout matrix material 1010 in an embodiment, though in other embodiments NSs 900 can be distributed according to an application-specific uniformity distribution function. It should be noted that even though NSs 900 are shown to have the same size in diameter, a person skilled in the art would understand that NSs 900 can have a size distribution.

In an embodiment, NSs 900 can include a homogenous population of NSs having sizes that emit in the blue visible wavelength spectrum, in the green visible wavelength spectrum, or in the red visible wavelength spectrum. In other embodiments, NSs 900 can include a first population of NSs having sizes that emit in the blue visible wavelength spectrum, a second population of NSs having sizes that emit in the green visible wavelength spectrum, and a third population of NSs that emit in the red visible wavelength spectrum.

Matrix material 1010 can be any suitable host matrix material capable of housing NSs 900. Suitable matrix materials can be chemically and optically compatible with NSs 900 and any surrounding packaging materials or layers used in applying NS film 1000 to devices. Suitable matrix materials can include non-yellowing optical materials that are transparent to both the primary and secondary light, thereby allowing for both primary and secondary light to transmit through the matrix material. In an embodiment, matrix material 1010 can completely surround each of the NSs 900. The matrix material 1010 can be flexible in applications where a flexible or moldable NS film 1000 is desired. Alternatively, matrix material 1010 can include a high-strength, non-flexible material.

Matrix material 1010 can include polymers, other semiconducting nanoparticles, organic and inorganic oxides, or other semiconducting or insulating materials. Suitable polymers for use in matrix material 1010 can be any polymer known to the ordinarily skilled artisan that can be used for such a purpose. The polymer can be substantially translucent or substantially transparent. Matrix material 1010 can include, but not limited to, epoxies, acrylates, norbornene, polyethylene, poly(vinyl butyral):poly(vinyl acetate), polyurea, polyurethanes; silicones and silicone derivatives including, but not limited to, amino silicone (AMS), polyphenylmethylsiloxane, polyphenylalkylsiloxane, polydiphenylsiloxane, polydialkylsiloxane, silsesquioxanes, fluorinated silicones, and vinyl and hydride substituted silicones; acrylic polymers and copolymers formed from monomers including, but not limited to, methylmethacrylate, butylmethacrylate, and laurylmethacrylate; styrene-based polymers such as polystyrene, amino polystyrene (APS), and poly(acrylonitrile ethylene styrene) (AES); polymers that are crosslinked with bifunctional monomers, such as divinylbenzene; cross-linkers suitable for cross-linking ligand materials, epoxides that combine with ligand amines (e.g., APS or PEI ligand amines) to form epoxy, and the like.

In some embodiments, matrix material 1010 includes scattering microbeads such as $TiO_2$ microbeads, ZnS microbeads, or glass microbeads that can improve photo conversion efficiency of NS film 1000. In some embodiments, matrix material 1010 can include conductive or semiconductive materials.

In another embodiment, matrix material 1010 can have low oxygen and moisture permeability, exhibit high photo- and chemical-stability, exhibit favorable refractive indices, and adhere to outer surfaces of NSs 900, thus providing an air-tight seal to protect NSs 900. In another embodiment, matrix material 1010 can be curable with UV or thermal curing methods to facilitate roll-to-roll processing.

According to some embodiments, NS film 1000 can be formed by mixing NSs 900 in a polymer (e.g., photoresist) and casting the NS-polymer mixture on a substrate, mixing NSs 900 with monomers and polymerizing them together, mixing NSs 900 in a sol-gel to form an oxide, or any other method known to those skilled in the art.

Example Embodiments of Luminescent Nanostructures

Described herein are various compositions having luminescent nanostructures (NSs). The various properties of the luminescent nanostructures, including their absorption properties, emission properties and refractive index properties, can be tailored and adjusted for various applications.

The material properties of NSs can be substantially homogenous, or in some embodiments, can be heterogeneous. The optical properties of NSs can be determined by their particle size, chemical or surface composition. The ability to tailor the luminescent NS size in the range between about 1 nm and about 20 nm can enable photoemission coverage in the entire optical spectrum to offer great versatility in color rendering. Particle encapsulation can offer robustness against chemical and UV deteriorating agents.

Luminescent NSs, for use in embodiments described herein can be produced using any method known to those skilled in the art. Suitable methods and example nanocrystals are disclosed in U.S. Pat. No. 7,374,807; U.S. patent application Ser. No. 10/796,832, filed Mar. 10, 2004; U.S. Pat. No. 6,949,206; and U.S. Provisional Patent Application No. 60/578,236, filed Jun. 8, 2004, the disclosures of each of which are incorporated by reference herein in their entireties.

Luminescent NSs for use in embodiments described herein can be produced from any suitable material, including an inorganic material, and more suitably an inorganic conductive or semiconductive material. Suitable semiconductor materials can include those disclosed in U.S. patent application Ser. No. 10/796,832, and can include any type of semiconductor, including group II-VI, group III-V, group IV-VI, group and group IV semiconductors. Suitable semiconductor materials can include, but are not limited to, Si, Ge, Sn, Se, Te, B, C (including diamond), P, BN, BP, BAs, AlN, AlP, AlAs, AlSb, GaN, GaP, GaAs, GaSb, InN, InP, InAs, InSb, AlN, AlP, AlAs, AlSb, GaN, GaP, GaAs, GaSb, ZnO, ZnS, ZnSe, ZnTe, CdS, CdSe, CdTe, HgS, HgSe, HgTe, BeS, BeSe, BeTe, MgS, MgSe, GeS, GeSe, GeTe, SuS, SnSe, SnTe, PbO, PbS, PbSe, PbTe, CuF, CuCl, CuBr, CuI, $Si_3N_4$, $Ge_3N_4$, $Al_2O_3$, $(Al, Ga, In)_2 (S, Se, Te)_3$, $Al_2CO$, CuInGaS, CuInGaSe, and an appropriate combination of two or more such semiconductors.

In some embodiments, the luminescent NSs can have a dopant from the group consisting of a p-type dopant or an n-type dopant. The NSs can also have II-VI or III-V semiconductors. Examples of II-VI or III-V semiconductor NSs can include any combination of an element from Group II, such as Zn, Cd and Hg, with any element from Group VI, such as S, Se, Te and Po, of the Periodic Table; and any combination of an element from Group III, such as B, Al, Ga, In, and Tl, with any element from Group V, such as N, P, As, Sb and Bi, of the Periodic Table.

The luminescent NSs, described herein can also further include ligands conjugated, cooperated, associated or attached to their surface. Suitable ligands can include any group known to those skilled in the art, including those disclosed in U.S. Pat. No. 8,283,412; U.S. Patent Publication No. 2008/0237540; U.S. Patent Publication No. 2010/0110728; U.S. Pat. Nos. 8,563,133; 7,645,397; 7,374,807; 6,949,206; 7,572,393; and 7,267,875, the disclosures of each of which are incorporated herein by reference. Use of such ligands can enhance the ability of the luminescent NSs to incorporate into various solvents and matrixes, including polymers. Increasing the miscibility (i.e., the ability to be mixed without separation) of the luminescent NSs in various solvents and matrixes can allow them to be distributed throughout a polymeric composition such that the NSs do not aggregate together and therefore do not scatter light. Such ligands are described as "miscibility-enhancing" ligands herein.

In some embodiments, compositions having luminescent NSs distributed or embedded in a matrix material are provided. Suitable matrix materials can be any material known to the ordinarily skilled artisan, including polymeric materials, organic and inorganic oxides. Compositions described herein can be layers, encapsulants, coatings, sheets or films. It should be understood that in embodiments described herein where reference is made to a layer, polymeric layer, matrix, sheet or film, these terms are used interchangeably, and the embodiment so described is not limited to any one type of composition, but encompasses any matrix material or layer described herein or known in the art.

Down-converting NSs (for example, as disclosed in U.S. Pat. No. 7,374,807) utilize the emission properties of luminescent nanostructures that are tailored to absorb light of a particular wavelength and then emit at a second wavelength, thereby providing enhanced performance and efficiency of active sources (e.g., LEDs).

While any method known to the ordinarily skilled artisan can be used to create luminescent NSs, a solution-phase colloidal method for controlled growth of inorganic nanomaterial phosphors can be used. See Alivisatos, A. P., "Semiconductor clusters, nanocrystals, and quantum dots," Science 271:933 (1996); X. Peng, M. Schlamp, A. Kadavanich, A. P. Alivisatos, "Epitaxial growth of highly luminescent CdSe/CdS Core/Shell nanocrystals with photostability and electronic accessibility," *J. Am. Chem. Soc.* 30:7019-7029 (1997); and C. B. Murray, D. J. Norris, M. G. Bawendi, "Synthesis and characterization of nearly monodisperse CdE (E=sulfur, selenium, tellurium) semiconductor nanocrystallites," *J Am. Chem. Soc.* 115:8706 (1993), the disclosures of which are incorporated by reference herein in their entireties.

According to an embodiment, CdSe can be used as the NS material, in one example, for visible light down-conversion, due to the relative maturity of the synthesis of this material. Due to the use of a generic surface chemistry, it can also possible to substitute non-cadmium-containing NSs.

In semiconductor NSs, photo-induced emission arises from the band edge states of the NS. The band-edge emission from luminescent NSs competes with radiative and non-radiative decay channels originating from surface electronic states. X. Peng, et al., *J Am. Chem. Soc.* 30:7019-7029 (1997). As a result, the presence of surface defects such as dangling bonds provide non-radiative recombination centers and contribute to lowered emission efficiency. An efficient and permanent method to passivate and remove the surface trap states can be to epitaxially grow an inorganic shell material on the surface of the NS. X. Peng, et al., *J. Am. Chem. Soc.* 30:701 9-7029 (1997). The shell material can be chosen such that the electronic levels are type 1 with respect to the core material (e.g., with a larger bandgap to provide a potential step localizing the electron and hole to the core). As a result, the probability of non-radiative recombination can be reduced.

Core-shell structures can be obtained by adding organometallic precursors containing the shell materials to a reaction mixture containing the core NSs. In this case, rather than a nucleation event followed by growth, the cores act as the nuclei, and the shells can grow from their surface. The temperature of the reaction is kept low to favor the addition of shell material monomers to the core surface, while preventing independent nucleation of nanocrystals of the shell materials. Surfactants in the reaction mixture are present to direct the controlled growth of shell material and to ensure solubility. A uniform and epitaxially grown shell can be obtained when there is a low lattice mismatch between the two materials.

Example materials for preparing core-shell luminescent NSs can include, but are not limited to, Si, Ge, Sn, Se, Te, B, C (including diamond), P, Co, Au, BN, BP, BAs, AlP, AlAs, AlSb, GaN, GaP, GaAs, GaSb, InN, InP, InAs, InSb, AlN, AlP, AlAs, AlSb, GaN, GaP, GaAs, GaSb, ZnO, ZnS, ZnSe, ZnTe, CdS, CdSe, CdTe, HgS, HgSe, HgTc, BeS, BcSe, BcTe, MgS, MgSe, GeS, GeSe, GeTe, SnS, SnSe, SnTe, PbO, PbS, PbSe, PbTe, CuP, CuCl, CuBr, CuI, $Si_3N_4$, $Ge_3N_4$, $Al_2O_3$, $(Al, Ga, In)_2 (S, Se, Te)_3$, AlCO, and shell luminescent NSs for use in the practice of the present invention include, but are not limited to, (represented as Core/Shell), CdSe/ZnS, InP/ZnS, InP/ZnSe, PbSe/PbS, CdSe/CdS, CdTe/CdS, CdTe/ZnS, as well as others.

Luminescent NSs for use in the embodiments described herein can be less than about 100 nm in size, and down to less than about 1 nm in size and absorb visible light. As used herein, visible light is electromagnetic radiation with wavelengths between about 380 and about 780 nanometers that is visible to the human eye. Visible light can be separated into the various colors of the spectrum, such as red, orange, yellow, green, blue, indigo and violet. Blue light can comprise light between about 435 nm and about 495 nm, green light can comprise light between about 495 nm and 570 nm and red light can comprise light between about 620 nm and about 750 nm in wavelength.

According to various embodiments, the luminescent NSs can have a size and a composition such that they absorb photons that are in the ultraviolet, near-infrared, and/or infrared spectra. The ultraviolet spectrum can comprise light between about 100 nm to about 400 nm, the near-infrared spectrum can comprise light between about 750 nm to about 100 μm in wavelength, and the infrared spectrum can comprise light between about 750 nm to about 300 μm in wavelength.

While luminescent NSs of other suitable material can be used in the various embodiments described herein, in some embodiments, the NSs can be ZnSe, ZnTe, ZnS, InAs, InP, CdSe, or any combination thereof to form a population of nanocrystals for use in the embodiments described herein. As discussed above, in further embodiments, the luminescent NSs can be core/shell nanocrystals, such as CdSe/ZnS, InP/ZnSe, CdSe/CdS or InP/ZnS.

Suitable luminescent nanostructures, methods of preparing luminescent nanostructures, including the addition of various solubility-enhancing ligands, can be found in Published U.S. Patent Publication No. 2012/0113672, the disclosure of which is incorporated by reference herein in its entirety.

It is to be understood that while some embodiments have been illustrated and described herein, the claims are not to be limited to the specific forms or arrangement of parts described and shown. In the specification, there have been disclosed illustrative embodiments and, although specific terms are employed, they are used in a generic and descriptive sense only and not for purposes of limitation. Modifications and variations of the embodiments are possible in light of the above teachings. It is therefore to be understood that the embodiments can be practiced otherwise than as specifically described.

What is claimed is:

1. A flexible electroluminescent (FEL) device comprising:
   a device stack comprising a quantum dot (QD) film configured to generate a first light having a first peak wavelength;
   a flexible substrate configured to support the device stack and emit a first portion of the first light;
   an encapsulation layer disposed on the device stack, wherein the encapsulation layer is configured to provide mechanical and environmental protection to the FEL device from moisture or oxygen;
   an outcoupling layer disposed on the flexible substrate, wherein the outcoupling layer is configured to:
      prevent total internal reflection of a second portion of the first light within the flexible substrate and extract the second portion from the flexible substrate; or
      eliminate air gaps at an interface between the outcoupling layer and a surface to be illuminated by the extracted second portion in response to the FEL device being substantially conformally placed on the surface; and
   a color processing layer interposed between the flexible substrate and the outcoupling layer, wherein the color processing layer is configured to down convert the first light to generate a second light having a second peak wavelength different from the first peak wavelength.

2. The FEL device of claim 1, further comprising a thermally conductive layer disposed on the encapsulation layer, wherein the thermally conductive layer is configured to dissipate heat away from the device stack.

3. The FEL device of claim 1, wherein the encapsulation layer is configured to dissipate heat away from the device stack.

4. The FEL device of claim 1, wherein the outcoupling layer is further configured to thermally insulate the surface from heat generated by the device stack.

5. The FEL device of claim 1, wherein the QD film comprises a population of cadmium-free QDs configured to emit red, green, blue light, or near infrared light.

6. The FEL device of claim 1, wherein the encapsulation layer comprises a coupling layer and a barrier film; and wherein the coupling layer includes a pressure sensitive adhesive layer and is configured to attach the barrier film to the device stack.

7. The FEL device of claim 1, further comprising a second encapsulation layer disposed on the flexible substrate or the outcoupling layer.

8. The FEL device of claim 1, further comprising a function layer disposed on the outcoupling layer, wherein the functional layer is configured to diffuse the first light substantially uniformly across a surface of the FEL device.

9. The FEL device of claim 1, wherein the flexible substrate includes a corrugated structure.

10. The FEL device of claim 3, wherein the thermally conductive layer includes a metal foil or a metal mesh structured layer.

11. A method of fabricating a flexible electroluminescent (FEL) device, the method comprising:
providing a flexible substrate with a layer of anode material;
forming a quantum dot (QD) film on the layer of anode material;
forming a cathode on the QD film;
forming an encapsulation layer on the cathode;
forming a color processing layer directly on the flexible substrate; and
forming an outcoupling layer on the flexible substrate.

12. The method of claim 11, wherein the providing of the flexible substrate comprises using a substrate material with a polyethylene terephthalate (PET) layer and a pre-deposited layer of anode material having indium-tin-oxide (ITO).

13. The method of claim 11, wherein the forming of the encapsulating layer comprises: disposing a pressure sensitive adhesive (PSA) layer on the cathode; and disposing a barrier film on the PSA layer.

14. The method of claim 13, wherein the disposing of the PSA layer and the barrier film comprises disposing a flexible adhesive material and a flexible barrier material, respectively, with a water vapor transmission rate (WVTR) ranging from about $10^{-5}$ g/m$^2$-day to about 10 g/m$^2$-day.

15. The method of claim 13, wherein the disposing of the PSA layer and the barrier film comprises disposing flexible materials.

16. The method of claim 13, wherein the disposing of the barrier film comprises disposing a metal laminate or a metal foil on the PSA layer.

17. The method of claim 13, wherein the disposing of the barrier film comprises disposing an optically transparent, reflective, or opaque material on the PSA layer.

18. The method of claim 11, further comprising forming a thermally conductive layer on the encapsulation layer.

19. The method of claim 11, wherein the color processing layer is arranged between the flexible substrate and the outcoupling layer.

* * * * *